(12) United States Patent
Kim et al.

(10) Patent No.: US 12,211,874 B2
(45) Date of Patent: Jan. 28, 2025

(54) IMAGE SENSOR

(71) Applicant: Samsung Electronics Co., Ltd., Suwon-si (KR)

(72) Inventors: Tae Han Kim, Hwaseong-si (KR); Dong Min Keum, Daegu (KR); Bum Suk Kim, Hwaseong-si (KR); Yun Ki Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 492 days.

(21) Appl. No.: 17/550,294

(22) Filed: Dec. 14, 2021

(65) Prior Publication Data

US 2022/0336513 A1 Oct. 20, 2022

(30) Foreign Application Priority Data

Apr. 20, 2021 (KR) ........................ 10-2021-0051004

(51) Int. Cl.
*H01L 27/146* (2006.01)
*H04N 25/704* (2023.01)

(52) U.S. Cl.
CPC .. *H01L 27/14627* (2013.01); *H01L 27/14621* (2013.01); *H01L 27/14645* (2013.01); *H04N 25/704* (2023.01)

(58) Field of Classification Search
CPC ......... H01L 27/14627; H01L 27/14621; H01L 27/14645; H01L 27/14603; H04N 25/704; H04N 25/134; H04N 25/79
See application file for complete search history.

(56) References Cited

U.S. PATENT DOCUMENTS

| | | | | |
|---|---|---|---|---|
| 2005/0133688 A1* | 6/2005 | Li | .................. | G02B 3/0018 |
| | | | | 359/622 |
| 2011/0221947 A1* | 9/2011 | Awazu | ................ | G02B 3/0043 |
| | | | | 348/311 |
| 2013/0242161 A1 | 9/2013 | Kobayashi et al. | | |
| 2016/0088245 A1* | 3/2016 | Nakata | ................ | H04N 25/134 |
| | | | | 257/432 |
| 2017/0366770 A1* | 12/2017 | Yokogawa | ........... | H04N 25/134 |
| 2020/0235149 A1* | 7/2020 | Shiraishi | ........... | H01L 27/14607 |
| 2021/0368117 A1* | 11/2021 | Nishi | .................. | G02B 5/30 |
| 2022/0181370 A1* | 6/2022 | Lin | .................. | G02B 7/36 |

FOREIGN PATENT DOCUMENTS

| | | |
|---|---|---|
| JP | 2017-041474 A | 2/2017 |
| JP | 2020-161648 A | 10/2020 |
| KR | 19990084556 A | 12/1999 |
| KR | 20190017197 A | 2/2019 |
| WO | WO-20012860 A1 | 1/2001 |

* cited by examiner

*Primary Examiner* — Thanh Luu
*Assistant Examiner* — Monica T Taba
(74) *Attorney, Agent, or Firm* — Harness, Dickey & Pierce, P.L.C.

(57) ABSTRACT

An image sensor includes different first and second focus pixels in a substrate; a first adjacent pixel in the substrate and adjacent to the first focus pixel in a positive first direction, a pixel being absent between the first focus pixel and the first adjacent pixel; a first micro-lens covering the first adjacent pixel; a second adjacent pixel in the substrate and adjacent to the second focus pixel in a positive first direction, a pixel being absent between the second focus pixel and the second adjacent pixel; and a second micro-lens covering the second adjacent pixel, and an area of the first micro-lens being different from an area of the second micro-lens.

20 Claims, 27 Drawing Sheets

US 12,211,874 B2

IMAGE SENSOR

CROSS-REFERENCE TO RELATED APPLICATION

This application claims priority from Korean Patent Application No. 10-2021-0051004 filed on Apr. 20, 2021 in the Korean Intellectual Property Office, and all the benefits accruing therefrom under 35 U.S.C. § 119, the contents of which in its entirety are herein incorporated by reference.

BACKGROUND

Some example embodiments relate to image sensors.

Image sensors refer to a device that captures a two-dimensional or three-dimensional image of an object. The image sensor generates an image of the object using a photoelectric conversion element that responds to an intensity of light reflected from the object. With recent development of CMOS (complementary metal-oxide semiconductor) technology, a CMOS based image sensor using the CMOS has been widely used.

SUMMARY

Some example embodiments provide image sensors in which sizes and/or areas of micro-lenses respectively covering adjacent pixels respectively adjacent to focus pixels may be different from each other, thereby compensating for a difference between an intensity of a pixel signal output from the adjacent pixel and an intensity of a pixel signal output from a normal pixel.

According to some example embodiments of inventive concepts, an image sensor includes different first and second focus pixels in a substrate; a first adjacent pixel in the substrate and adjacent to the first focus pixel in a positive first direction, a pixel being absent between the first focus pixel and the first adjacent pixel; a first micro-lens covering the first adjacent pixel; a second adjacent pixel in the substrate and adjacent to the second focus pixel in a positive first direction, a pixel being absent between the second focus pixel and the second adjacent pixel; and a second micro-lens covering the second adjacent pixel, and an area of the first micro-lens is different from an area of the second micro-lens.

According to some example embodiments of inventive concepts, an image sensor includes a substrate including a first surface on which light is incident, and a second surface opposite the first surface; a first focus pixel and a first adjacent pixel in the substrate, wherein the first focus pixel and the first adjacent pixel are separated from each other via a pixel separation pattern, and are sequentially arranged in a positive first direction and are adjacent to each other, a pixel being absent between the first focus pixel and the first adjacent pixel; a second focus pixel and a second adjacent pixel in the substrate, wherein the second focus pixel and the second adjacent pixel are separated from each other via the pixel separation pattern, and are sequentially arranged in the positive first direction and are adjacent to each other, a pixel being absent between the second focus pixel and the second adjacent pixel; a first micro-lens on the first surface of the substrate, and covering the first adjacent pixel; a second micro-lens on the first surface of the substrate, and covering the second adjacent pixel; a third micro-lens on the first surface of the substrate, and covering the first focus pixel; and a fourth micro-lens on the first surface of the substrate, and covering the second focus pixel, a minimum spacing between the first micro-lens and the third micro-lens in the first direction is different from a minimum spacing between the second micro-lens and the fourth micro-lens in the first direction.

According to some example embodiments of inventive concepts, an image sensor includes different first to third focus pixels in a substrate; a first adjacent pixel in the substrate and adjacent to the first focus pixel in a positive first direction, a pixel being absent between the first focus pixel and the first adjacent pixel; a second adjacent pixel in the substrate and adjacent to the second focus pixel in the positive first direction, a pixel being absent between the second focus pixel and the second adjacent pixel; a third adjacent pixel in the substrate and adjacent to the third focus pixel in the positive first direction, a pixel being absent between the third focus pixel and the third adjacent pixel; a normal pixel in the substrate and not adjacent to the first focus pixel, the second focus pixel, and the third focus pixel; a first micro-lens covering the first adjacent pixel; a second micro-lens covering the second adjacent pixel; a third micro-lens covering the third adjacent pixel; and a fourth micro-lens covering the normal pixel, an area of the first micro-lens being different from each of an area of the second micro-lens, an area of the third micro-lens, and an area of the fourth micro-lens.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

BRIEF DESCRIPTION OF DRAWINGS

The above and other aspects and features of the present disclosure will become more apparent by describing in detail example embodiments thereof with reference to the attached drawings, in which.

DETAILED DESCRIPTIONS

Figure 1:
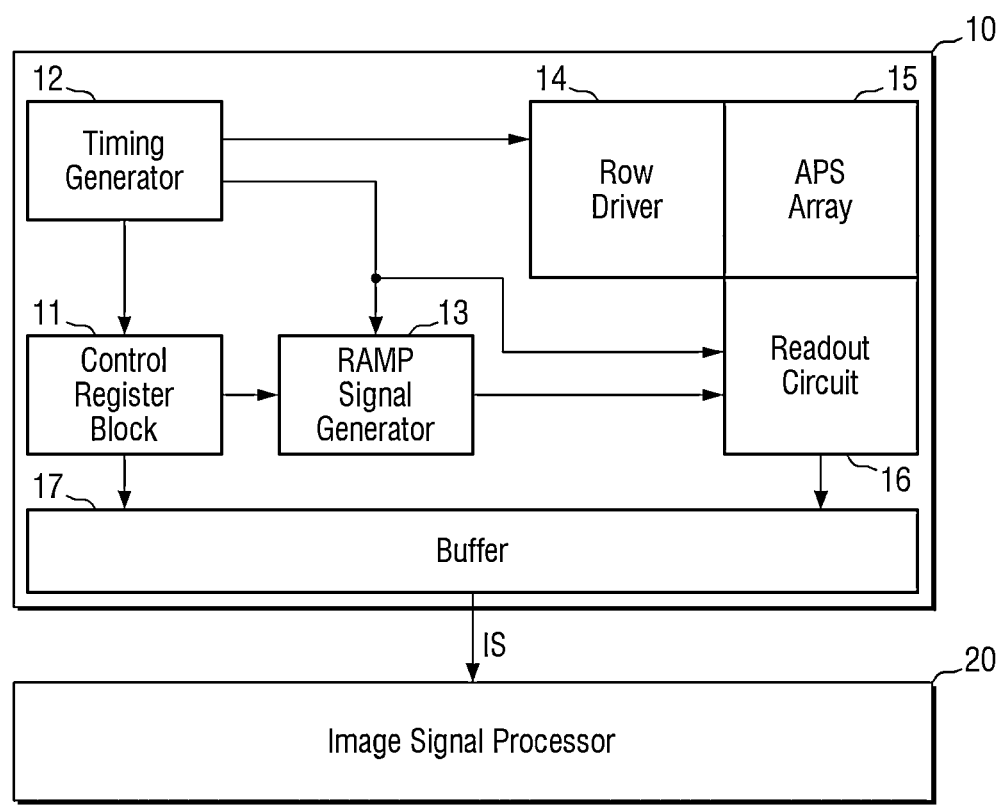
FIG. 1 is a block diagram for illustration of an image sensing device according to some example embodiments.

FIG. 1 is a block diagram for illustration of an image sensing device according to some example embodiments.

Referring to FIG. 1, an image sensing device 1 according to some example embodiments may include an image sensor 10 and an image signal processor 20.

The image sensor 10 may sense an image of a sensing target using light to generate an image signal IS. In some example embodiments, the generated image signal IS may be, for example, a digital signal. However, some example embodiments according to the technical idea of the present disclosure is not limited thereto.

The image signal IS may be provided to the image signal processor 20 in which the signal may be processed. The image signal processor 20 may receive the image signal IS output from the buffer 17 of the image sensor 10 and process the received image signal IS so as to be easily displayed on a display.

In some example embodiments, the image signal processor 20 may perform digital binning on the image signal IS output from the image sensor 10. In this connection, the image signal IS output from the image sensor 10 may be a raw image signal from an active pixel sensor array (APS) 15 which may not be subjected to analog binning or may be an image signal on which the analog binning has already been performed.

In some example embodiments, the image sensor 10 and the image signal processor 20 may be separated from each other as shown. For example, the image sensor 10 may be mounted on a first chip, and the image signal processor 20 may be mounted on a second chip while the image sensor 10 and the image signal processor 20 may communicate with each other over a predefined (e.g., desired or selected) interface. However, example embodiments are not limited thereto. The image sensor 10 and the image signal processor 20 may be embodied as one package, for example, an MCP (multi-chip package).

The image sensor 10 may include the active pixel sensor array 15, a control register block 11, a timing generator 12, a row driver 14, a readout circuit 16, a ramp signal generator 13, and a buffer 17.

The control register block 11 may control all of operations of the image sensor 10. In particular, the control register block 11 may transmit an operation signal directly to the timing generator 12, the ramp signal generator 13, and the buffer 17.

The timing generator 12 may generate a signal acting as a reference for an operation timing of each of various components of the image sensor 10. The operation timing reference signal generated by the timing generator 12 may be transmitted to the ramp signal generator 13, the row driver 14, the readout circuit 16, and the like.

The ramp signal generator 13 may generate and transmit a ramp signal used in the readout circuit 16. For example, the readout circuit 16 may include a correlated double sampler (CDS), a comparator, etc. The ramp signal generator 13 may generate and transmit the ramp signal used in the correlated double sampler, the comparator, and the like.

The row driver 14 may selectively activate a row of the active pixel sensor array 15.

The active pixel sensor array 15 may sense an external image. The active pixel sensor array 15 may include a plurality of pixels.

The readout circuit 16 may sample a pixel signal provided from the active pixel sensor array 15, and compare the sampled pixel signal with the ramp signal, and then convert an analog image signal (data) into a digital image signal (data) based on the comparison result.

The buffer 17 may include, for example, a latch. The buffer 17 may temporarily store therein the image signal IS to be provided to an external component, and may transmit the image signal IS to an external memory or an external device.

Figure 2:
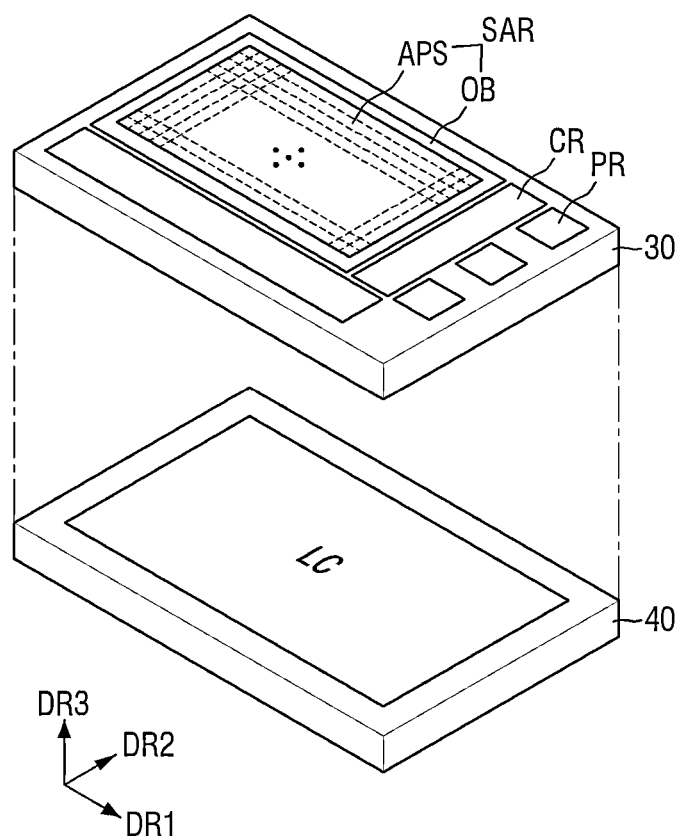
FIG. 2 is a block diagram to illustrate an image sensor according to some example embodiments.

FIG. 2 is a block diagram to illustrate an image sensor according to some example embodiments.

Referring to FIG. 2, the image sensor 10 of the present implementation may include a stack of a first chip 30 and a second chip 40. The second chip 40 may be stacked, for example, on the first chip 30 in a third direction DR3.

The first chip 30 may include a sensor array area SAR, a connection area CR, and a pad area PR.

The sensor array area SAR may include an area corresponding to the active pixel sensor array 15 of FIG. 1. For example, a plurality of pixels arranged two-dimensionally (e.g., in a matrix form) may be disposed in the sensor array area SAR. The sensor array area SAR may include a light-receiving area APS and a light-blocking area OB. Active pixels that receive light and generate an active signal may be arranged in the light-receiving area APS. In the light-blocking area OB, optical black pixels that block light and generate an optical black signal may be arranged. The light-blocking area OB may be formed, for example, along a periphery of the light-receiving area APS. However, this is only exemplary.

In some example embodiments, a photoelectric conversion layer may not be formed in a portion of the light-blocking area OB. Further, in some example embodiments, dummy pixels may be formed in a portion of the light-receiving area APS adjacent to the light-blocking area OB.

The connection area CR may be formed around the sensor array area SAR. The connection area CR may be formed on one side of the sensor array area SAR. However, this is only exemplary. Lines may be formed in the connection area CR, and may be configured to transmit and receive an electrical signal of the sensor array area SAR.

The pad area PR may be formed around the sensor array area SAR. The pad area PR may be formed adjacent to an edge of the image sensor according to some example embodiments. However, this is only exemplary. The pad area PR may be connected to an external device and the like, and may be configured to transmit/receive an electrical signal between the image sensor according to some example embodiments and the external device.

Although the connection area CR is shown to be interposed between the sensor array area SAR and the pad area PR, this is only exemplary. In some example embodiments, the arrangement of the sensor array area SAR, the connection area CR, and the pad area PR may vary according to need or desire.

The second chip 40 may be disposed below the first chip 30, and may include a logic circuit area LC. The second chip 40 may be electrically connected to the first chip 30. The logic circuit area LC of the second chip 18 may be electrically connected to the sensor array area SAR via, for example, the pad area CR of the first chip 30.

The logic circuit area LC may include a plurality of elements for driving the sensor array area SAR. The logic circuit area LC may include, for example, the control register block 11, the timing generator 12, the ramp signal generator 13, the row driver 14, and the readout circuit 16 of FIG. 1.

Figure 3:
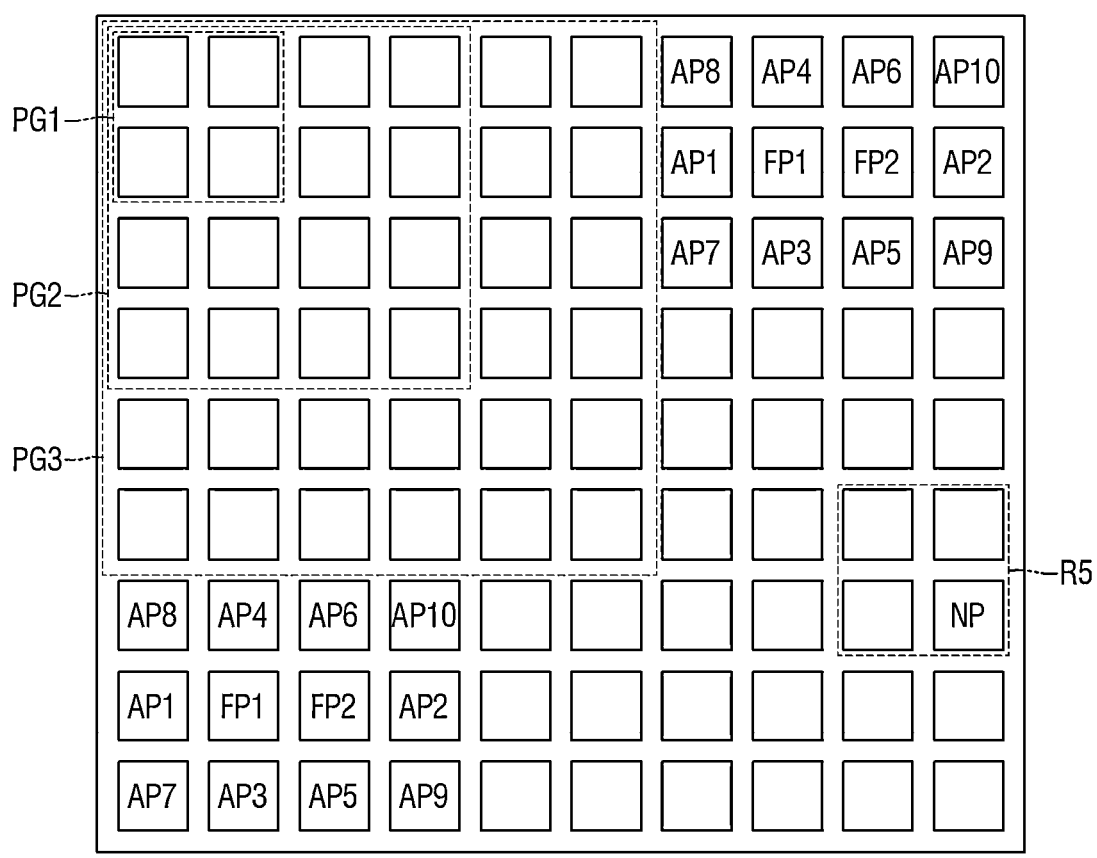
FIG. 3 is a schematic layout diagram to illustrate a light-receiving area of an image sensor according to some example embodiments.
Figure 3:
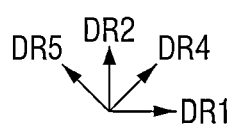

FIG. 3 is a schematic layout diagram to illustrate a light-receiving area of an image sensor according to some example embodiments.

Referring to FIG. 3, a plurality of focus pixels FP1 and FP2, a plurality of adjacent pixels AP1 to AP10, and a plurality of normal pixels NP may be disposed in the light-receiving area APS of the image sensor according to some example embodiments. The plurality of focus pixels FP1 and FP2, the plurality of adjacent pixels AP1 to AP10, and the plurality of normal pixels NP may be arranged in a two-dimensional manner, for example, in a matrix form, and in a plane including a first direction DR1 and a second direction DR2. The active pixel sensor array 15 in FIG. 1 may include an area corresponding to the light-receiving area APS.

The focus pixels FP1 and FP2 may be arranged in the first direction DR1 and/or the second direction DR2 and in the light-receiving area APS. The second direction DR2 may intersect the first direction DR1.

In the image sensor according to some example embodiments, the focus pixels FP1 and FP2 may include, for example, a first focus pixel FP1 and a second focus pixel FP2 adjacent to each other. That is, the focus pixels FP1 and FP2 may occupy an area corresponding to twice of an area of one normal pixel and/or one adjacent pixel. However, the present disclosure is not limited thereto. The focus pixel may include at least two focus pixels.

No pixel may be disposed between the first focus pixel FP1 and the second focus pixel FP2. For example, the first focus pixel FP1 and the second focus pixel FP2 may be adjacent to each other in the first direction DR1, while no pixel may be disposed between the first focus pixel FP1 and the second focus pixel FP2. In a following description, when two components are "adjacent" to each other, this may mean that no component is disposed between the two components. In still another example, unlike shown in the figure, the first focus pixel FP1 and the second focus pixel FP2 may be adjacent to each other in the second direction DR2, while no pixel may be disposed between the first focus pixel FP1 and the second focus pixel FP2. As such, it will be understood that orientations may change while retaining the spatial relationship between pixels, for example, the first focus pixel FP1 and the second focus pixel FP2.

Each of the focus pixels FP1 and FP2 may perform an auto focus function (AF). Each of the focus pixels FP1 and FP2 may perform the auto focus function using phase detection AF (PDAF).

The adjacent pixels AP1 to AP10 may be arranged around the focus pixels FP1 and FP2. The adjacent pixels AP1 to AP10 may be disposed adjacent to the focus pixels FP1 and FP2, such that no pixel may be disposed between the adjacent pixels AP1 to AP10 and the focus pixels FP1 and FP2. For example, a first adjacent pixel AP1, the first focus pixel FP1, the second focus pixel FP2, and a second adjacent pixel AP2 may be sequentially arranged in the first direction DR1, while no pixel may be disposed therebetween. That is, the first adjacent pixel AP1 may be adjacent to the first focus pixel FP1 in a negative first direction DR1, while the second adjacent pixel AP2 may be adjacent to the second focus pixel FP2 in a positive first direction DR1. A third adjacent pixel AP3, the first focus pixel FP1 and a fourth adjacent pixel AP4 may be arranged sequentially in the second direction DR2 such that no pixel may be disposed therebetween. A fifth adjacent pixel AP5, the second focus pixel FP2, and a sixth adjacent pixel AP6 may be arranged sequentially in the second direction DR2 such that no pixel may be disposed therebetween. That is, the third adjacent pixel AP3 and the first focus pixel FP1 and may be arranged in a positive second direction DR2. The fifth adjacent pixel AP5 and the second focus pixel FP2 may be arranged in a positive second direction DR2. The fourth adjacent pixel AP4 and the first focus pixel FP1 may be arranged in a negative second direction DR2. The sixth adjacent pixel AP6 and the second focus pixel FP2 may be arranged in a negative second direction DR2. In this connection, a positive direction means a direction according to an arrow shown in the drawing, while a negative direction means an opposite direction to the positive direction. A seventh adjacent pixel AP7 may be adjacent to the first focus pixel FP1 in a negative fifth fourth direction DR4. An eighth adjacent pixel AP8 may be adjacent to the first focus pixel FP1 in a positive fifth direction DR5. A ninth adjacent pixel AP9 may be adjacent to the second focus pixel FP2 in a negative fifth direction DR5. A tenth adjacent pixel AP10 may be adjacent to the second focus pixel FP2 in a positive fourth direction DR4. No pixel may not be disposed between the seventh adjacent pixel AP7 and the first focus pixel FP1, between the eighth adjacent pixel AP8 and the first focus pixel FP1, between the ninth adjacent pixel AP9 and the second focus pixel FP2, and between the tenth adjacent pixel AP10 and the second focus pixel FP2. The positive fourth direction DR4 may be a diagonal direction between the positive first direction DR1 and the positive second direction DR2. The positive fifth direction DR5 may be a diagonal direction between the negative first direction DR1 and the positive second direction DR2.

The normal pixel NP may be disposed adjacent to the adjacent pixels AP1 to AP10. The normal pixel NP may mean pixels other than the adjacent pixels AP1 to AP10 and the focus pixels FP1 and FP2.

Figure 4:
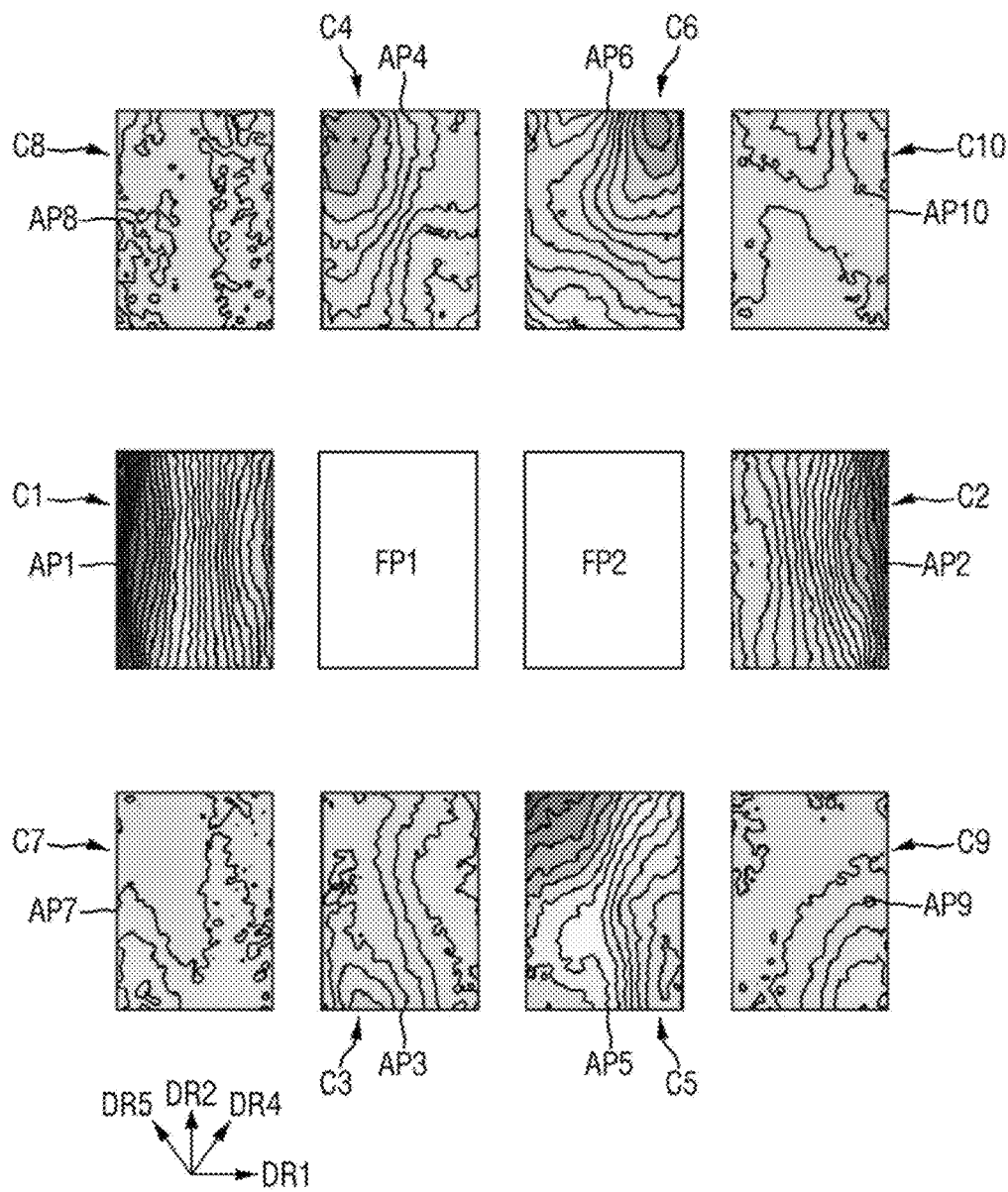
FIG. 4 is a diagram to illustrate a pixel signal of the light-receiving area of FIG. 3.

FIG. 4 is a diagram to illustrate a pixel signal of the light-receiving area of FIG. 3.

Referring to FIG. 3 and FIG. 4, each of first to tenth contours C1 to C10 represents an intensity of a pixel signal output from each of the first to tenth adjacent pixels AP1 to AP10 based on a position of each of the first to tenth adjacent pixels AP1 to AP10 in the light-receiving area APS, relative to an intensity of a pixel signal output from the normal pixel NP. As the contour becomes a darker gray color, (e.g., closer to black) this indicates that the intensity of the pixel signal is greater than the intensity of the pixel signal output from the normal pixel NP (e.g., in adjacent pixels AP1, AP2, and AP5). As the contour becomes a lighter gray color (e.g., closer to white), this indicates that the intensity of the pixel signal is the same as the intensity of the pixel signal output from the normal pixel NP. As the contour becomes a gray color, this indicates that the intensity of the pixel signal is lower than the intensity of the pixel signal output from the normal pixel NP (e.g., in adjacent pixels AP3, AP4, AP6, and AP10 compared to the darker gray).

Each of the plurality of focus pixels FP1 and FP2, the plurality of adjacent pixels AP1 to AP10, and the plurality of normal pixels NP may detect light incident from an outside using a photoelectric conversion layer 112 to be described later to generate photo-charges, and may convert the photo-charges into a voltage or current signal and output the voltage or current signal as the pixel signal.

One micro-lens may be disposed on the focus pixels FP1 and FP2 to simultaneously cover the focus pixels FP1 and FP2. Each micro-lens covering each of the adjacent pixels AP1 to AP10 and the normal pixel NP may be disposed on each of the adjacent pixels AP1 to AP10 and the normal pixel NP. A shape and/or a size of the micro-lens covering the focus pixels FP1 and FP2 may be different from a shape and/or a size of each micro-lens covering each of the adjacent pixels AP1 to AP10 and/or the normal pixel NP. Accordingly, the pixel signal output from each of the adjacent pixels AP1 to AP10 adjacent to the focus pixels FP1 and FP2 may be different from the pixel signal output from the normal pixel NP as each of the first to tenth contour C1 to C10 may be so. Thus, an image may be deteriorated due to a difference between the intensity of the pixel signal output from each of the adjacent pixels AP1 to AP10 adjacent to the focus pixels FP1 and FP2 and the intensity of the pixel signal output from the normal pixel NP.

For example, a first contour C1 represents the intensity of the pixel signal of the first adjacent pixel AP1 adjacent to the first focus pixel FP1 in the negative first direction DR1, based on a position in the light-receiving area APS. Referring to the first contour C1, as a position is farther away from a center of the light-receiving area APS in the negative first direction DR1, the intensity of the pixel signal output from the first adjacent pixel AP1 is greater than the intensity of the pixel signal output from the normal pixel NP. As a position is farther away from the center of the light-receiving area APS in the positive first direction DR1, the intensity of the pixel signal output from the first adjacent pixel AP1 is lower than the intensity of the pixel signal output from the normal pixel NP. In some example embodiments, a sixth contour C6 represents the intensity of the pixel signal of the sixth adjacent pixel AP6 adjacent to the second focus pixel FP2 in the positive second direction DR2, based on a position in the light-receiving area APS. Referring to the sixth contour C6, the intensity of the pixel signal output from the sixth adjacent pixel AP6 is lower than the intensity of the pixel signal output from the normal pixel NP as the position is farther away from the center of the light-receiving area APS in the positive first direction DR1. The intensity of the pixel signal output from the sixth adjacent pixel AP6 is lower than the intensity of the pixel signal output from the normal pixel NP as the position is farther away from the center of the light-receiving area APS in the positive second direction DR2.

Therefore, in the image sensor according to some example embodiments, the size and/or area of the micro-lens covering each of the adjacent pixels AP1 to AP10 may be adjusted to compensate for the difference between the intensity of the pixel signal output from each of the adjacent pixel AP1 to AP10 and an intensity of the pixel signal output from the normal pixel NP. Hereinafter, this will be described in detail with reference to FIG. 5, FIG. 6, FIG. 7A to FIG. 7e and FIG. 8A to FIG. 8D.

Figure 5:
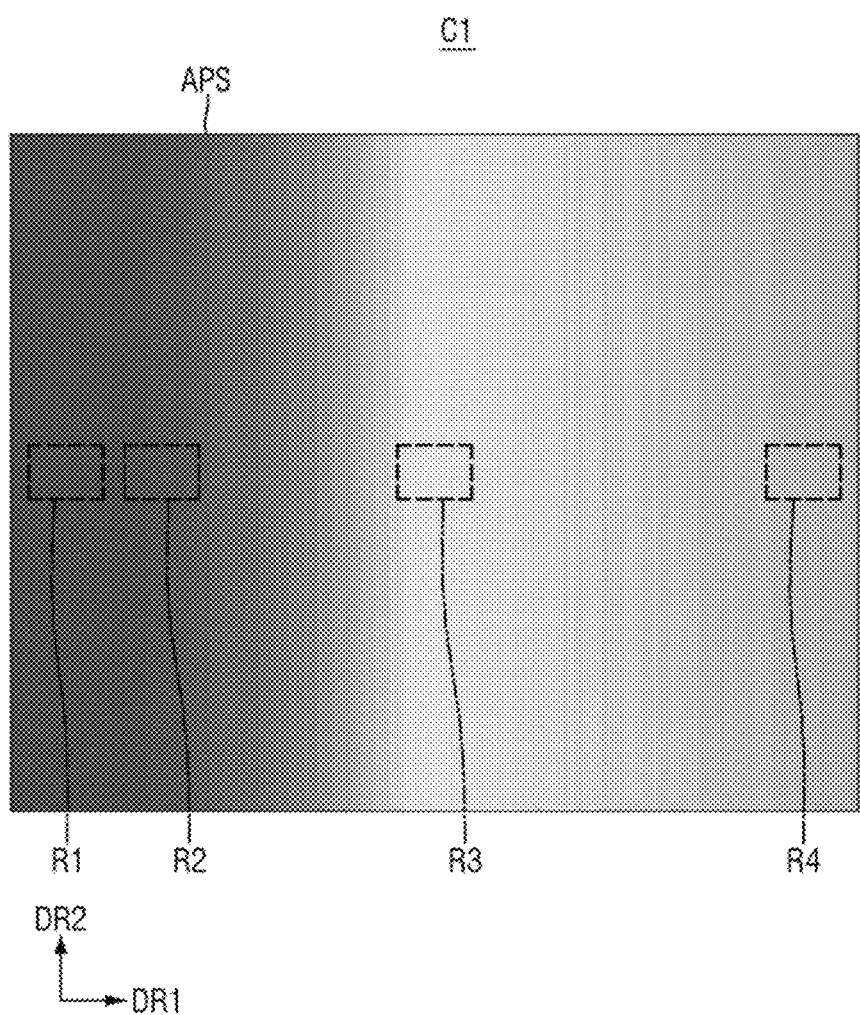
FIG. 5 is an enlarged view of a first contour of FIG. 4.
Figure 6:
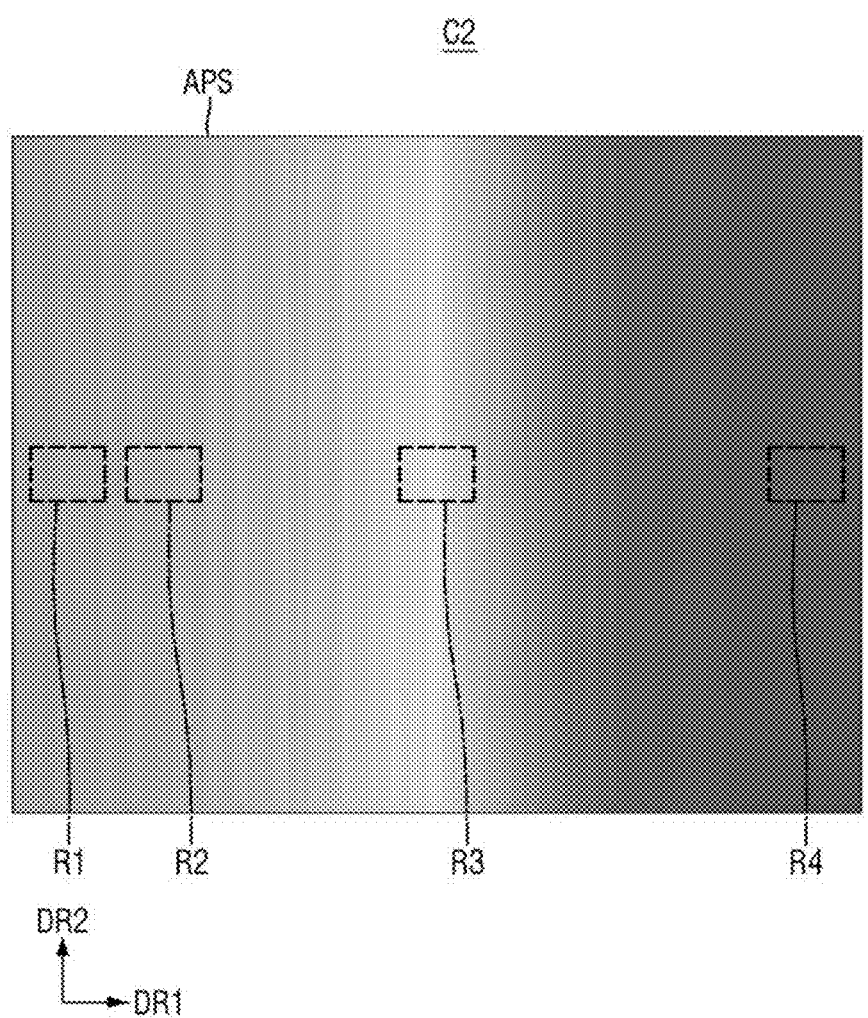
FIG. 6 is an enlarged view of a second contour of FIG. 4.
Figure 7A:
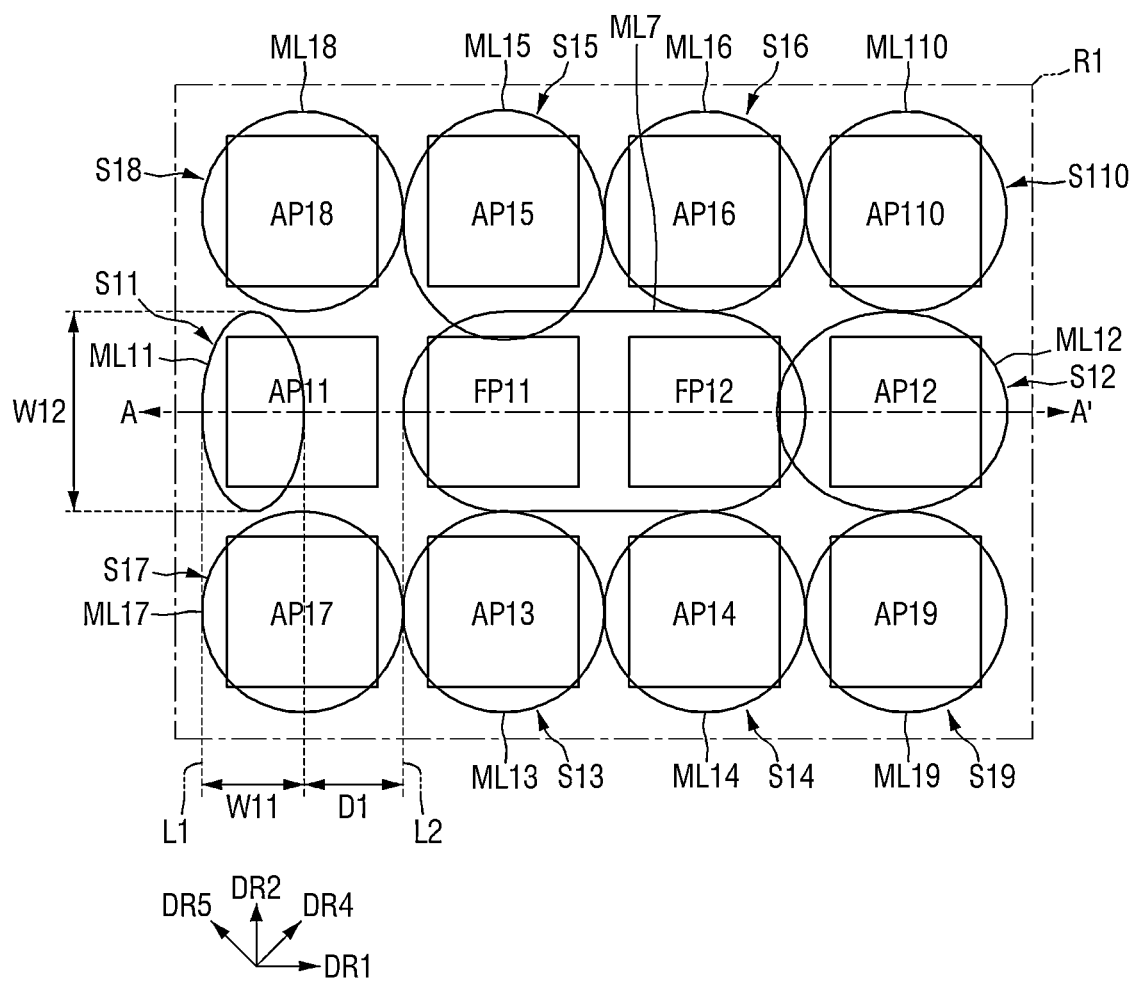
FIG. 7A to FIG. 7D are respectively schematic layout diagrams to illustrate a R1 area to a R4 area of FIG. 5 and FIG. 6.
Figure 7B:
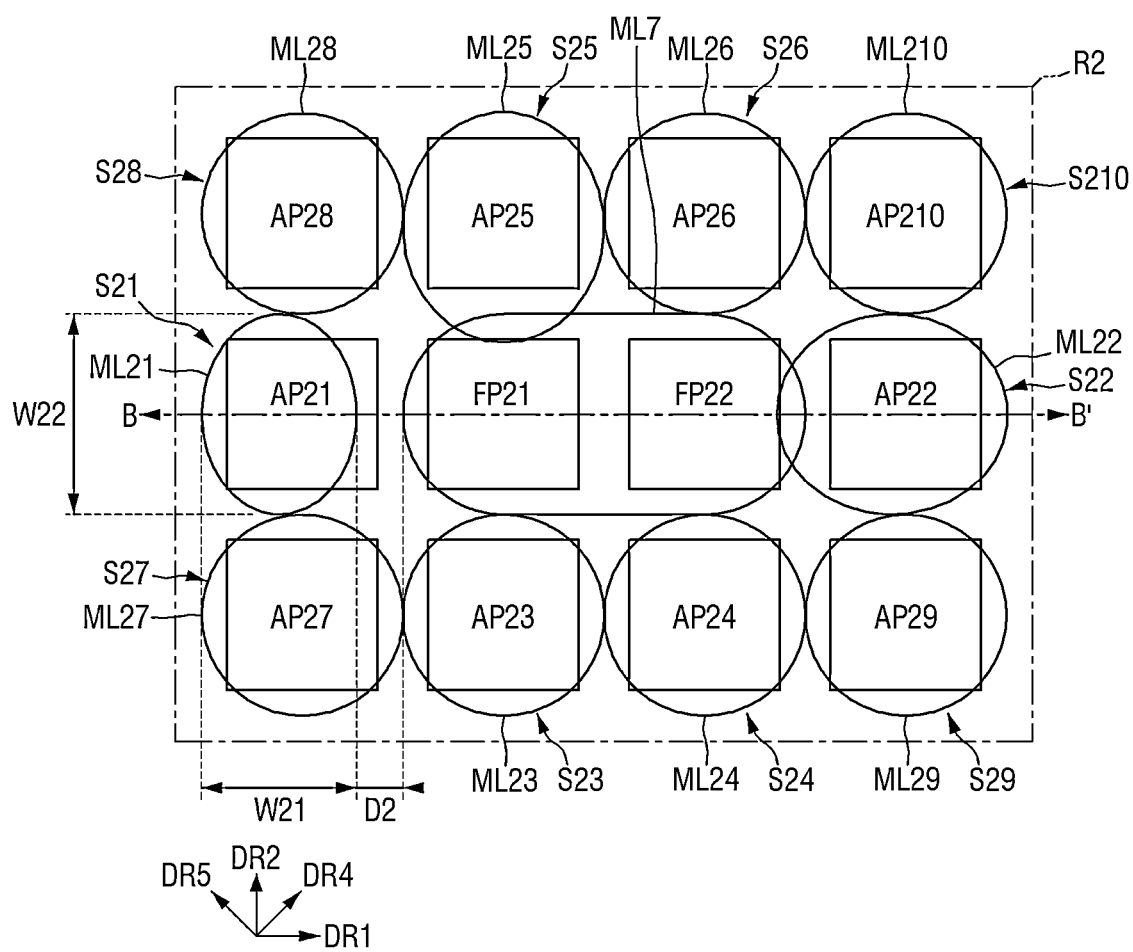
Figure 7C:
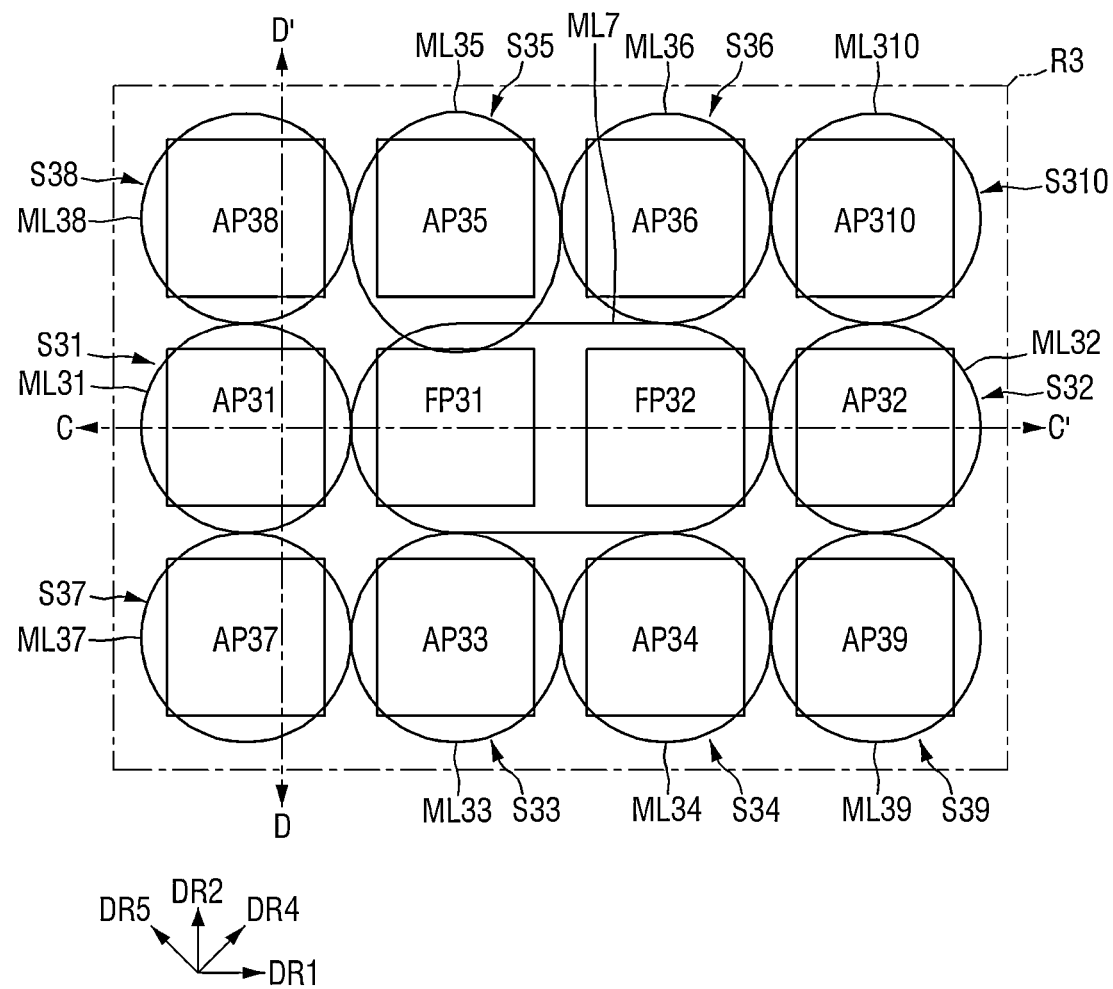
Figure 7D:
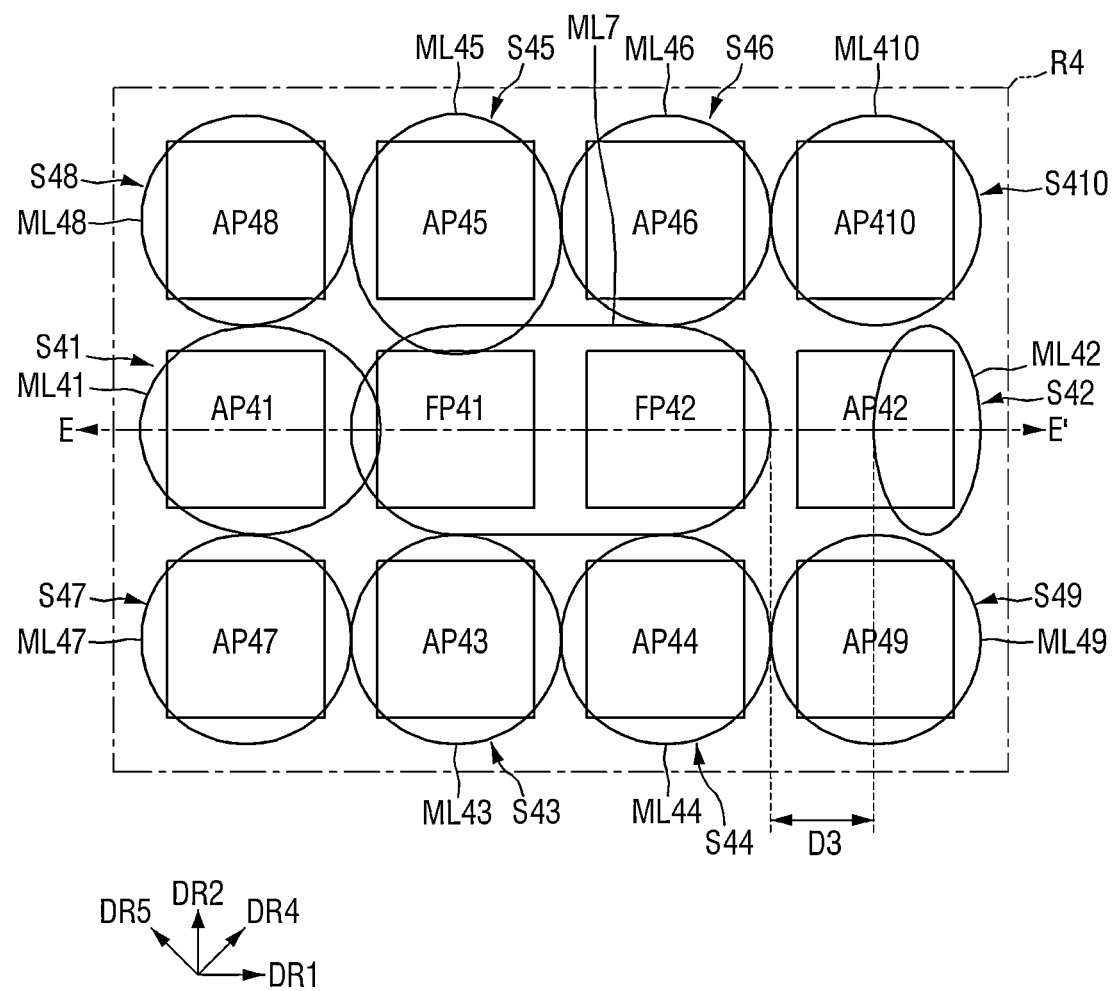
Figure 7E:
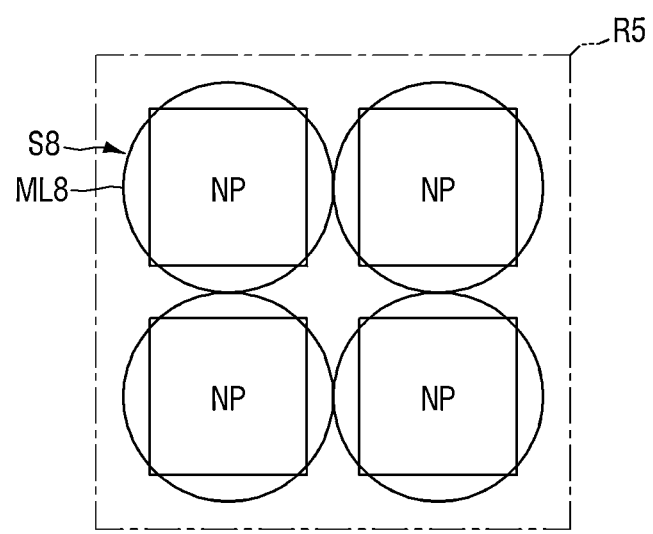
FIG. 7E is a schematic layout diagram to illustrate a R5 area of FIG. 3.
Figure 7E:
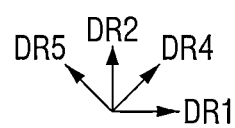
Figure 8A:
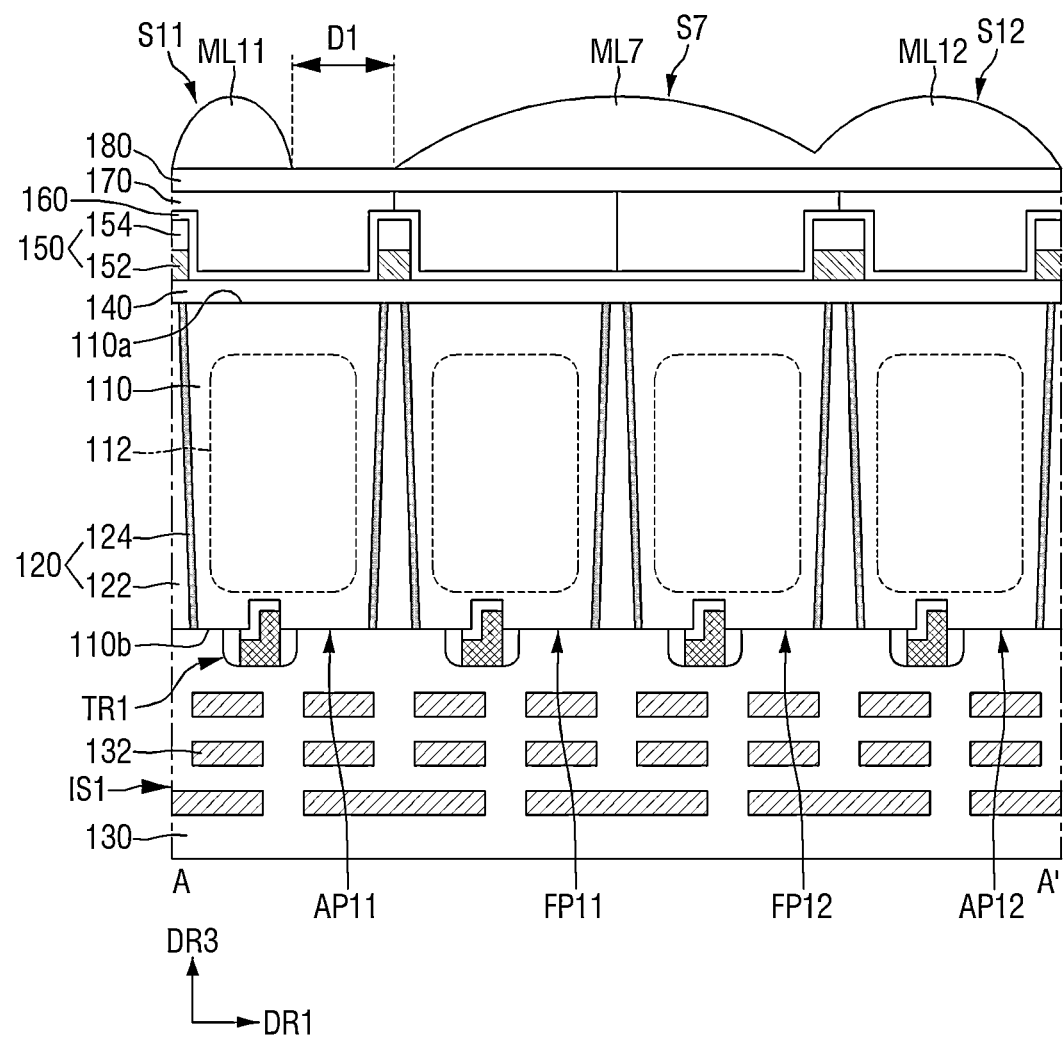
FIG. 8A is a cross-sectional view taken along a line A-A' of a R1 area.
Figure 8B:
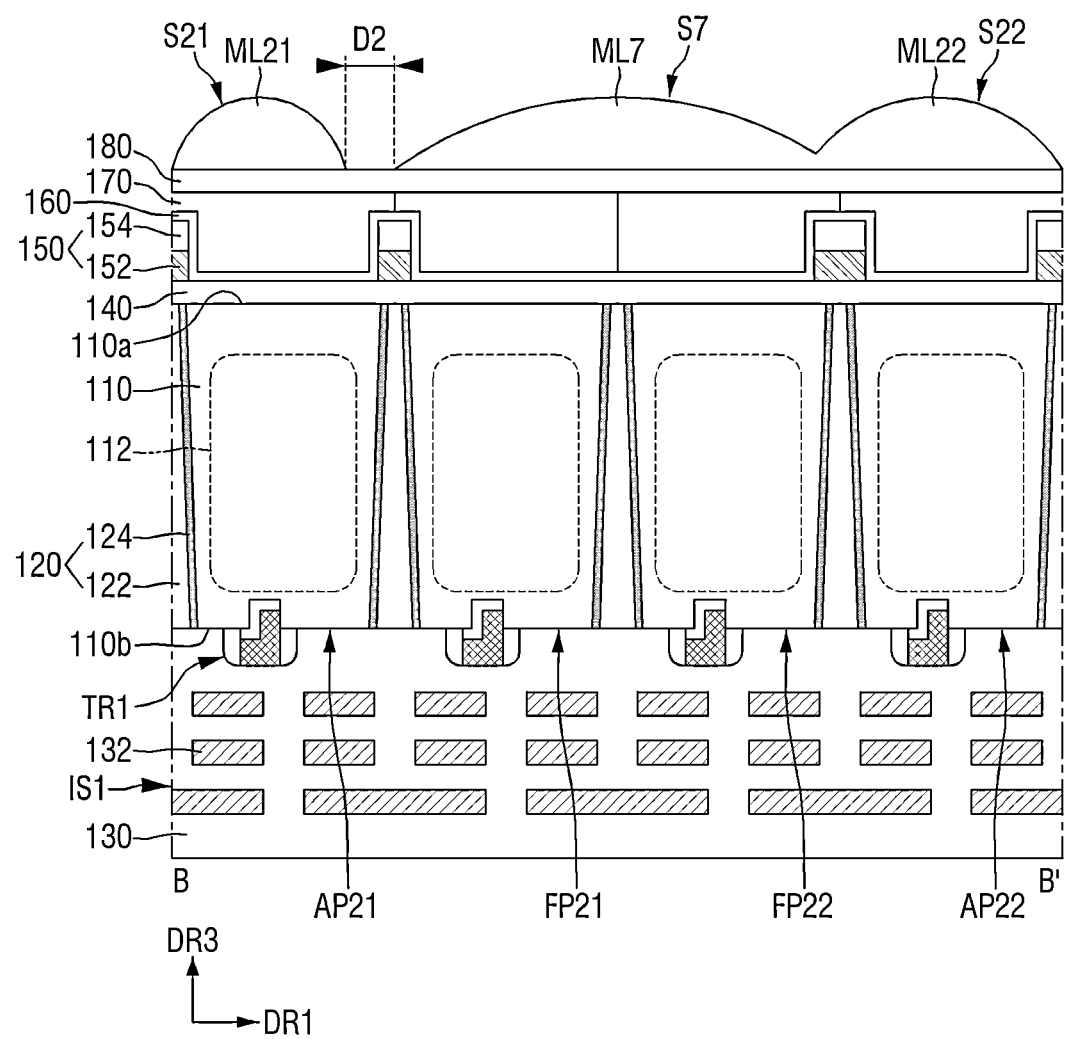
FIG. 8B is a cross-sectional view taken along a line B-B' of a R2 area.
Figure 8C:
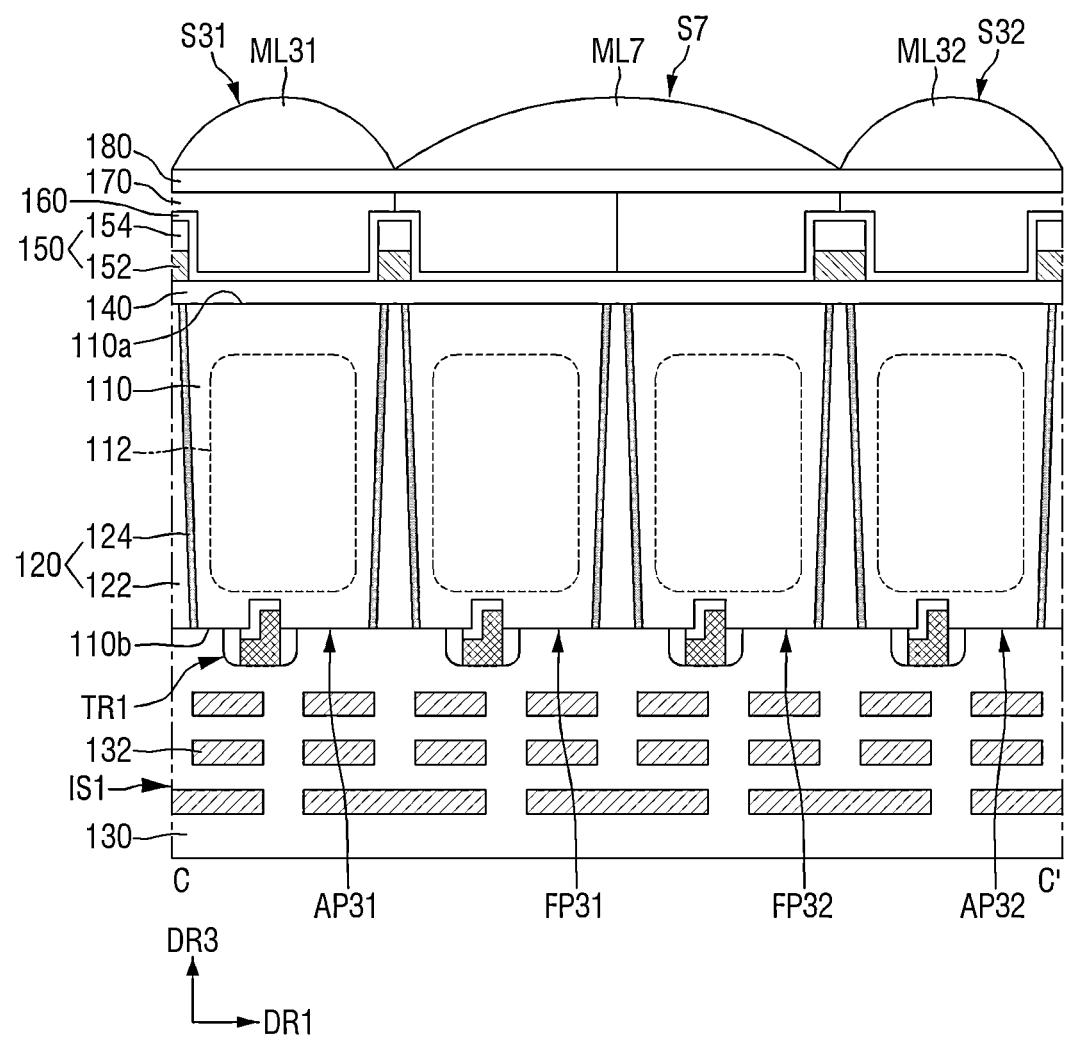
FIG. 8C is a cross-sectional view taken along a line C-C' of a R3 are.
Figure 8D:
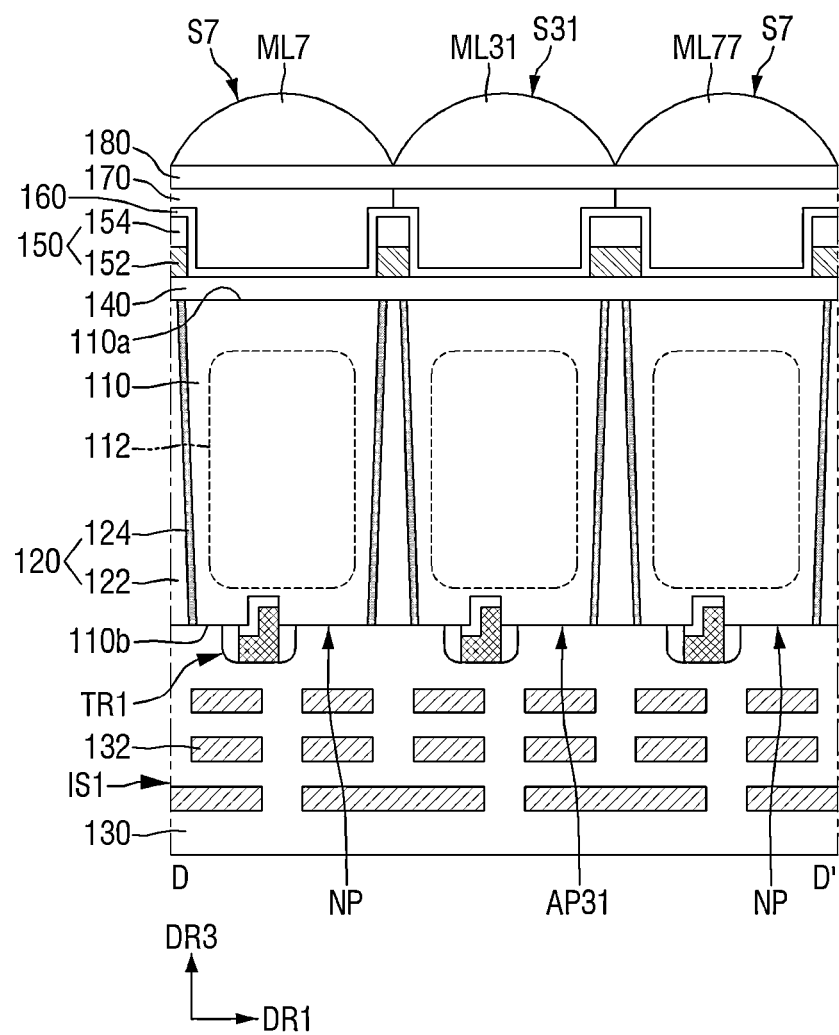
FIG. 8D is a cross-sectional view taken along a line D-D' of a R3 area.
Figure 8E:
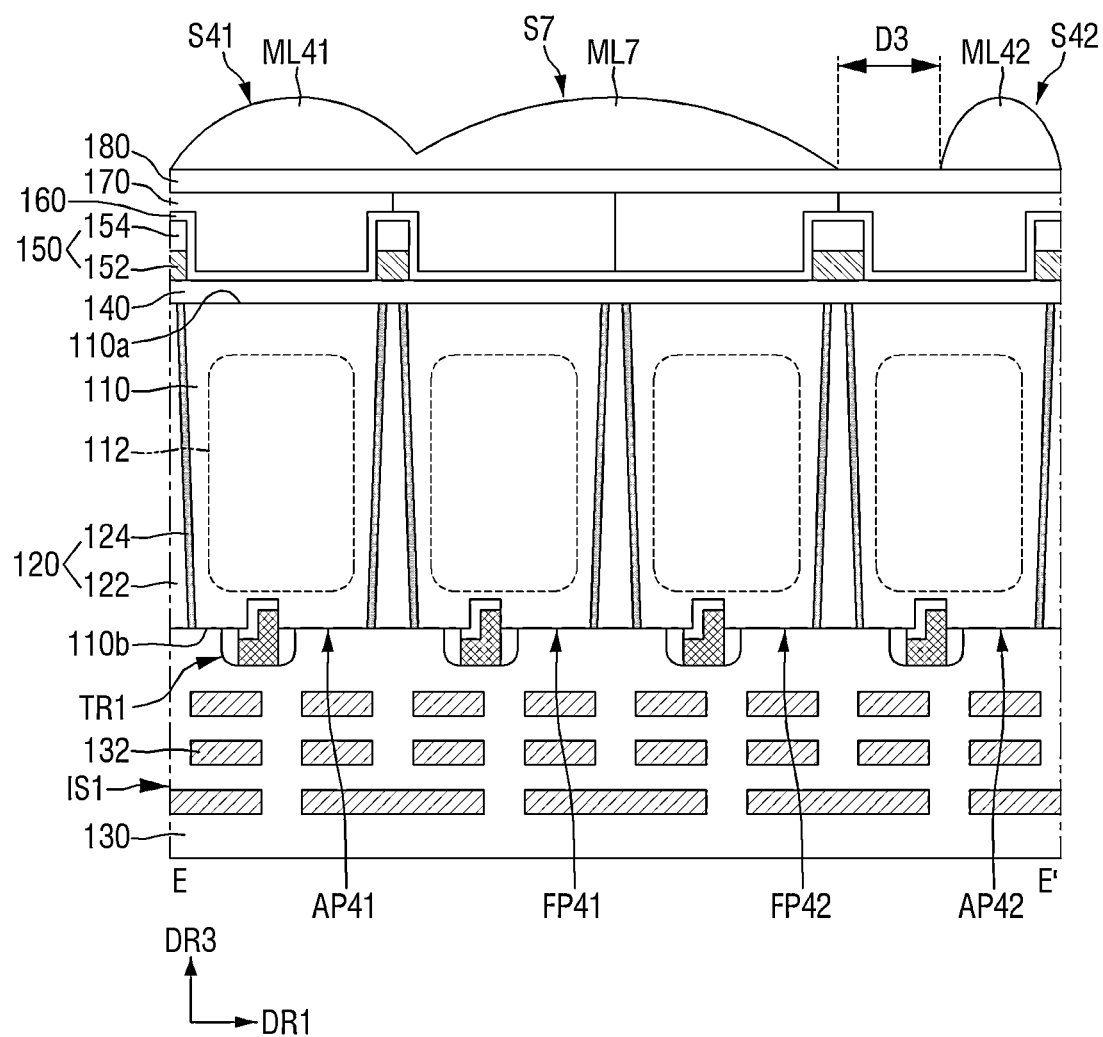
FIG. 8E is a cross-sectional view taken along a line E-E' of a R4 area.

FIG. 5 is an enlarged view of the first contour C1 of FIG. 4, and FIG. 6 is an enlarged view of the second contour C2 of FIG. 4. FIG. 7A to FIG. 7D are schematic layout diagrams to illustrate a R1 area to a R4 area of FIG. 5 and FIG. 6, respectively. FIG. 7E is a schematic layout diagram to illustrate a R5 area of FIG. 3. FIG. 8A is a cross-sectional view taken along a line A-A' of the R1 area. FIG. 8B is a cross-sectional view taken along a line B-B' of the R2 area. FIG. 8C is a cross-sectional view taken along a line C-C' of the R3 area. FIG. 8D is a cross-sectional view taken along a line D-D' of the R3 area. FIG. 8E is a cross-sectional view taken along a line E-E' of the R4 area.

Referring to FIG. 5, FIG. 6, FIG. 7A to FIG. 7D and FIG. 8A to FIG. 8E, the R1 area may include a first-first focus pixel FP11, a first-second focus pixel FP12, first-first to first-tenth adjacent pixels AP11 to AP110 (as in AP11, AP12, AP13, AP14, AP15, AP16, AP17, AP18, AP19, and AP110) adjacent to the first-first focus pixel FP11 and the first-second focus pixel FP12, and the normal pixel NP. No pixel may be disposed between the first-first focus pixel FP11 and the first-second focus pixel FP12 and the first-first to first-tenth adjacent pixels AP11 to AP110. The R2 area may include a second-first focus pixel FP21, a second-second focus pixel FP22, second-first to second-tenth adjacent pixels AP21 to AP210 (as in AP21, AP22, AP23, AP24, AP25, AP26, AP27, AP28, AP29, and AP210) adjacent to the second-first focus pixel FP21 and the second-second focus pixel FP22, and the normal pixel NP. No pixel may be disposed between the second-first focus pixel FP21 and the second-second focus pixel FP22 and the second-first to second-tenth adjacent pixels AP21 to AP210. The R3 area may include a third-first focus pixel FP31, a third-second focus pixel FP32, third-first to third-tenth adjacent pixels AP31 to AP310 (as in AP31, AP32, AP33, AP34, AP35, AP36, AP37, AP38, AP39, and AP310) adjacent to the third-first focus pixel FP31 and the third-second focus pixel FP32, and the normal pixel NP. No pixel may be disposed between the third-first focus pixel FP31 and the third-second focus pixel FP32 and the third-first to third-tenth adjacent pixels AP31 to AP310. The R4 area may include a fourth-first focus pixel FP41, a fourth-second focus pixel FP42, fourth-first to fourth-tenth adjacent pixels AP41 to AP410 (as in AP41, AP42, AP43, AP44, AP45, AP46, AP47, AP48, AP49, and AP410) adjacent to the fourth-first focus pixel FP41 and the fourth-second focus pixel FP42, and the normal pixel NP. No pixel may be disposed between the fourth-first focus pixel FP41 and the fourth-second focus pixel FP42 and the fourth-first to fourth-tenth adjacent pixels AP41 to AP410.

The image sensor according to some example embodiments includes a first substrate 110, the photoelectric conversion layer 112, a pixel separation pattern 120, a first electronic element TR1, a first line structure IS1, a surface insulating film 140, a color filter layer 170, a grid pattern 150, a planarization film 180, and an micro-lens array ML11 to ML110, ML21 to ML210, ML31 to ML310, ML41 to ML410, M7, and M8.

The first substrate 110 may be a semiconductor substrate. For example, the first substrate 110 may be made of bulk silicon or (SOI) silicon-on-insulator. The first substrate 110 may be a silicon substrate. Alternatively, the first substrate 110 may be made of a material such as silicon germanium, indium antimonide, lead tellurium compound, indium arsenide, indium phosphide, gallium arsenide and/or gallium antimonide. Alternatively, the first substrate 110 may include a base substrate and an epitaxial layer formed on the base substrate.

The first substrate 110 may include a first surface 110a and a second surface 110b opposite to each other. In example embodiments as described below, the first surface 110a may be referred to as a back side of the first substrate 110, while the second surface 110b may be referred to as a front side of the first substrate 110. In some example embodiments, the first surface 110a of the first substrate 110 may act as a light-receiving surface on which the light is incident. That is, the image sensor according to some example embodiments may be embodied as a back side irradiated (BSI) image sensor.

The photoelectric conversion layer 112 may be formed in the first substrate 110. A plurality of photoelectric conversion layers 112 may be arranged to respectively correspond to the plurality of focus pixels FP1 and FP2, the plurality of adjacent pixels AP1 to AP10, and the plurality of normal pixels NP. For example, the photoelectric conversion layers 112 may be arranged two-dimensionally, for example, in matrix form, and in a plane including the first direction DR1 and the second direction DR2 and may be respectively disposed in the plurality of focus pixels FP1 and FP2, the plurality of adjacent pixels AP1 to AP10, and the plurality of normal pixels NP. The photoelectric conversion layer 112 may generate charges in proportion to an amount of light incident from the outside.

The photoelectric conversion layer 112 may be formed by doping impurities into the first substrate 110. For example, the photoelectric conversion layer 112 may be formed via ion implantation of n-type impurities into a p-type first substrate 110. In some example embodiments, the photoelectric conversion layer 112 may have a potential slope in a vertical direction (DR3) normal to a surface of the first substrate 110, for example, the first surface 110a or the second surface 110b. For example, a concentration of the impurities in the photoelectric conversion layer 112 may decrease as the layer extends from the second surface 110b toward the first surface 110a.

The photoelectric conversion layer 112 may include at least one of, for example, a photo diode, a photo transistor, a photo gate, a pinned photo diode, an organic photo diode, a quantum dot, and combinations thereof. However, the present disclosure is not limited thereto.

The pixel separation pattern 120 may be formed in the first substrate 110. The pixel separation pattern 120 may define the plurality of focus pixels FP11, FP12, FP21, FP22, FP31, FP32, FP41, and FP42, the plurality of adjacent pixels AP11 to AP110, AP21 to AP210, AP31 to AP310, and AP41 to AP410, and the plurality of normal pixels NP in the first substrate 110. For example, the pixel separation pattern 120 may be formed in a grid form in a plan view and may surround each of the focus pixels FP11, FP12, FP21, FP22, FP31, FP32, FP41, and FP42, the adjacent pixels AP11 to AP110, AP21 to AP210, AP31 to AP310, and AP41 to AP410, and the normal pixels NP which may be arranged in a matrix form.

In some example embodiments, the pixel separation pattern 120 may extend through the first substrate 110. For example, the pixel separation pattern 120 may extend continuously from the second surface 110b of the first substrate 110 to the first surface 110a of the first substrate 110.

In some example embodiments, a width of the pixel separation pattern 120 may decrease as the pattern extends away from the second surface 110b of the first substrate 110. In this connection, the width means a width in a direction parallel to the surface of the first substrate 110, for example, the first surface 110a or the second surface 110b. This may be due to characteristics of an etching process for forming the pixel separation pattern 120. For example, a process of etching the first substrate 110 to form the pixel separation pattern 120 may be performed on the second surface 110b of the first substrate 110.

In some example embodiments, the pixel separation pattern 120 may include a conductive filling pattern 122 and an insulating spacer film 124. For example, in the first substrate 110, a separation trench defining the plurality of focus pixels FP1 and FP2, the plurality of adjacent pixels AP1 to AP10, and the plurality of normal pixels NP may be formed. The insulating spacer film 124 may extend along a side surface of the separation trench. The conductive filling pattern 122 may be formed on the insulating spacer film 124 to fill a remaining area of the separation trench. The insulating spacer film 124 may electrically insulate the conductive filling pattern 122 from the first substrate 110.

The conductive filling pattern 122 may include, for example, polysilicon (poly Si). However, the present disclosure is not limited thereto. In some example embodiments, a ground voltage or a negative voltage may be applied to the conductive filling pattern 122. In this case, ESD (electrostatic discharge) bruise defect of the image sensor may be effectively prevented, or the occurrence of may be reduced. In this connection, the ESD bruise defect refers to a phenomenon in which charges resulting from ESD are accumulated on the first substrate 110, thereby generating stains such as bruises on a resulting image.

The insulating spacer film 124 may include, for example, at least one of silicon oxide, aluminum oxide, tantalum oxide, and combinations thereof. However, the present disclosure is not limited thereto. In some example embodiments, the insulating spacer film 124 may include a low refractive index material having a lower refractive index than that of the first substrate 110. In this case, the insulating spacer film 124 may improve light condensing efficiency by refracting or reflecting the light incident obliquely to the photoelectric conversion layer 112, thereby improving the quality of the image sensor. Further, the insulating spacer film 124 may prevent or reduce photo-charges generated in a specific pixel due to the incident light from moving to an adjacent pixel via random drift.

The first electronic element TR1 may be formed on the second surface 110b of the first substrate 110. The first electronic element TR1 may include various transistors for processing an electrical signal generated from the pixels. For example, the first electronic element TR1 may include transistors such as a transmission transistor, a reset transistor, a source follower transistor, or a selection transistor.

In some example embodiments, the first electronic element TR1 may include a vertical transmission transistor (TG). For example, a portion of the first electronic element TR1 including the aforementioned vertical transmission transistor (TG) may extend into the first substrate 110. The vertical transmission transistor TG may reduce an area of a pixel, thereby enabling high integration of the image sensor.

The first line structure IS1 may be formed on the second surface 110b of the first substrate 110. The first line structure IS1 may include one or a plurality of lines. For example, the first line structure IS1 may include a first inter-line insulating film 130, and a plurality of first lines 132 in the first inter-line insulating film 130. The number of layers of lines constituting the first line structure IS1 shown in the drawings and the arrangement thereof are only exemplary. The technical spirit of the present disclosure is not limited thereto.

In some example embodiments, the first line 132 may be electrically connected to the pixels. For example, the first line 132 may be connected to the first electronic element TR1.

The surface insulating film 140 may be formed on the first surface 110a of the first substrate 110. The surface insulating film 140 may extend along the first surface 110a of the first substrate 110. The surface insulating film 140 may include, for example, at least one of silicon oxide, silicon nitride, silicon oxynitride, aluminum oxide, hafnium oxide, and combinations thereof. However, the present disclosure is not limited thereto.

In some example embodiments, the surface insulating film 140 may be composed of a multi-film. For example, the surface insulating film 140 may include an aluminum oxide film, a hafnium oxide film, a silicon oxide film, a silicon nitride film, and a hafnium oxide film that are sequentially stacked on the first surface 110a of the first substrate 110.

In some example embodiments, the surface insulating film 140 may function as a reflective anti-reflective film to prevent or reduce reflection of light incident on the first substrate 110. Accordingly, a light reception ability of the photoelectric conversion layer 112 may be improved. Further, the surface insulating film 140 may function as a planarization film, such that the color filter layer 170 and the micro-lens array ML11 to ML110, ML21 to ML210, ML31 to ML310, ML41 to ML410, M7, and M8 which will be described later may be formed to have a uniform vertical dimension.

The color filter layer 170 may be formed on the first surface 110a of the first substrate 110. For example, the color filter layer 170 may be formed on the surface insulating film 140. A plurality of color filter layers 170 may be arranged in a respectively corresponding manner to the focus pixels FP11, FP12, FP21, FP22, FP31, FP32, FP41, and FP42, the adjacent pixels AP11 to AP110, AP21 to AP210, AP31 to AP310, and AP41 to AP410, and the normal pixels NP. For example, the color filter layers 170 may be arranged in a plane including the first direction DR1 and the second direction DR2 and may be arranged two-dimensionally, for example, in a matrix form. Each of the color filter layers 170 may be disposed in each of the focus pixels FP11, FP12, FP21, FP22, FP31, FP32, FP41 and FP42, the adjacent pixels AP11 to AP110, AP21 to AP210, AP31 to AP310, and AP41 to AP410, and the normal pixels NP.

The color filter layer 170 may have various colors. For example, the color filter layer 170 may include a red color filter, a green color filter, and/or a blue color filter. However, this is only exemplary. The color filter layer 170 may include a yellow filter, a magenta filter, and/or a cyan filter. The color filter layer 170 may further include a white filter.

The grid pattern 150 may be formed on the second surface 110b of the first substrate 110. For example, the grid pattern 150 may be formed on the surface insulating film 140. The grid pattern 150 may be interposed between the color filter layers 170. For example, the grid pattern 150 may be formed in a grid form in a plan view to surround each of the color filter layers 170 arranged in a matrix form. In some example embodiments, the grid pattern 150 may be disposed to overlap the pixel separation pattern 120 in the third direction DR3. However, the grid pattern 150 may not be disposed between the first-first focus pixel FP11 and the first-second focus pixel FP12, between the second-first focus pixel FP21 and the second-second focus pixel FP22, between the third-first focus pixel FP31 and the third-second focus pixel FP32, and between the fourth-first focus pixel FP41 and the fourth-second focus pixel FP42.

In some example embodiments, the grid pattern 150 may include a first material pattern 152 and a second material pattern 154. The first material pattern 152 and the second material pattern 154 may be sequentially stacked on the surface insulating film 140. The first material pattern 152 and the second material pattern 154 may include different materials. In some example embodiments, the first material pattern 152 may be a metal pattern, while the second material pattern 154 may be an oxide pattern. In some example embodiments, the first material pattern 152 may be a first metal pattern while the second material pattern 154 may be a second metal pattern different from the first metal pattern.

The metal pattern may include, for example, at least one of titanium (Ti), titanium nitride (TiN), tantalum (Ta), tantalum nitride (TaN), tungsten (W), aluminum (Al), copper (Cu), and combinations thereof. However, the present disclosure is not limited thereto. In some example embodiments, the first material pattern 152 including the metal pattern prevents or reduces charges generated from the ESD from accumulating on the surface of the first substrate 110, for example, the first surface 110a, thereby effectively preventing, or may reduce the occurrence of the ESD bruise.

The oxide pattern may include, for example, at least one of metal oxides such as titanium oxide, tantalum oxide, tungsten oxide, aluminum oxide, copper oxide, silicon oxide, and combinations thereof. However, the present disclosure is not limited thereto. In some example embodiments, the second material pattern 154 may include a low refractive index material that has a lower refractive index than that of silicon (Si). In this case, the second material pattern 154 may improve the light condensing efficiency by refracting or reflecting the light incident obliquely to the photoelectric conversion layer 112, thereby improving the quality of the image sensor.

In some example embodiments, a first protective film 160 may be further formed on the surface insulating film 140 and the grid pattern 150. The first protective film 160 may conformally extend along a profile of a top surface of the surface insulating film 140, a side surface of the grid pattern 150, and a top surface of the grid pattern 150. The first protective film 160 may be interposed between the surface insulating film 140 and the color filter layer 170 and between the grid pattern 150 and the color filter layer 170.

The first protective film 160 may prevent or reduce damage to the surface insulating film 140 and the grid pattern 150. The first protective film 160 may include, for example, aluminum oxide. However, the present disclosure is not limited thereto.

The planarization film 180 may be formed on the color filter layer 170. The planarization film 180 may cover the color filter layer 170. The planarization film 180 may include insulating material. For example, the planarization film 180 may include silicon oxide. However, the present disclosure is not limited thereto.

The micro-lens array ML11 to ML110, ML21 to ML210, ML31 to ML310, ML41 to ML410, M7, and M8 (ML11 to ML110 includes ML11, ML12, ML13, ML14, ML15, ML16, ML17, ML18, ML19, and ML110, and the, ML21 to ML210, ML31 to ML310, ML41 to ML410 include similar groupings) may be formed on the first surface 110a of the first substrate 110. The micro-lens array ML11 to ML110, ML21 to ML210, ML31 to ML310, ML41 to ML410, M7, and M8 may be formed on the planarization film 180. The micro-lenses ML11 to ML110, ML21 to ML210, ML31 to ML310, ML41 to ML410, M7 and M8 may be arranged two-dimensionally, for example, in matrix form and in a plane including the first direction DR1 and the second direction DR2.

Each of the micro-lenses ML11 to ML110, ML21 to ML210, ML31 to ML310, ML41 to ML410, M7 and M8 may have a convex shape, and may have predefined (e.g., desired or selected) radius of curvature. Accordingly, each of the micro-lenses ML11 to ML110, ML21 to ML210, ML31 to ML310, ML41 to ML410, M7, and M8 may condense light incident on the photoelectric conversion layer 112. Each of the micro-lenses ML11 to ML110, ML21 to ML210, ML31 to ML310, ML41 to ML410, M7 and M8 may include, for example, a light-transmissive resin. However, the present disclosure is not limited thereto.

Each of first-first to first-tenth micro-lenses ML11 to ML110 may cover each of the first-first to first-tenth adjacent pixels AP11 to AP110. Each of second-first to second-tenth micro-lenses ML21 to ML210 may cover each of the second-first to second-tenth adjacent pixels AP21 to AP210. Each of third-first to third-tenth micro-lenses ML31 to ML310 may cover each of the third-first to third-tenth adjacent pixels AP31 to AP310. Each of fourth-first to fourth-tenth micro-lenses ML41 to ML410 may cover each of the fourth-first to fourth-tenth adjacent pixels AP41 to AP410. A seventh micro-lens ML7 may cover the first-first and first-second focus pixels FP11 and FP12, the second-first and second-second focus pixels FP21 and FP22, the third-first and third-second focus pixels FP31 and FP32, and the fourth-first and fourth-second focus pixels FP41 and FP42. The eighth micro-lens ML8 may cover the normal pixel NP.

Each of the first-first adjacent pixel AP11, the second-first adjacent pixel AP21, the third-first adjacent pixel AP31 and the fourth-first adjacent pixel AP41 may be adjacent to each of the first-first focus pixel FP11, the second-first focus pixel FP21, the third-first focus pixel FP31 and the fourth-first focus pixel FP41 in a negative first direction DR1.

Referring to FIG. 5 and FIG. 7A to FIG. 7D, the intensity of the pixel signal output from the first-first adjacent pixel AP11 in the R1 area is greater than the intensity of the pixel signal output from the normal pixel NP in the R1 area. The intensity of the pixel signal output from the second-first adjacent pixel AP21 in the R2 area is greater than the intensity of the pixel signal output from the normal pixel NP in the R2 area, but is lower than the intensity of the pixel signal output from the first-first adjacent pixel AP11. The intensity of the pixel signal output from the third-first adjacent pixel AP31 in the R3 area is the same or substantially the same as the intensity of the pixel signal output from the normal pixel NP in the R3 area. The intensity of the pixel signal output from the fourth-first adjacent pixel AP41 in the R4 area is lower than the intensity of the pixel signal output from the normal pixel NP in the R4 area. That is, the intensity of the pixel signal output from the first-first adjacent pixel AP11 is greater than the intensity of the pixel signal output from the second-first adjacent pixel AP21. The intensity of the pixel signal output from the second-first adjacent pixel AP21 is greater than the intensity of the pixel signal output from the third-first adjacent pixel AP31. The intensity of the pixel signal output from the third-first adjacent pixel AP31 is greater than the intensity of the pixel signal output from the fourth-first adjacent pixel AP41.

Accordingly, an area S11 of the first-first micro-lens ML11, an area S21 of the second-first micro-lens ML21, an area S31 of the third-first micro-lens ML31, and an area S41 of the fourth-first micro-lens ML41 may be different from each other. Each of the area S11 of the first-first micro-lens ML11 and the area S21 of the second-first micro-lens ML21 may be smaller than an area S8 of an eighth micro-lens ML8. The area S11 of the first-first micro-lens ML11 may be smaller than the area S21 of the second-first micro-lens ML21. The area S31 of the third-first micro-lens ML31 may be the same or substantially the same as the area S8 of the eighth micro-lens ML8. In this connection, "same" means not only exactly the same, but also includes a slight difference that may occur due to a margin on a process. The area S41 of the fourth-first micro-lens ML41 may be larger than the area S8 of the eighth micro-lens ML8. Accordingly, the intensity of the pixel signal output from each of the first-first adjacent pixel AP11 and the second-first adjacent pixel AP21 may be reduced, while the intensity of the pixel signal output from the fourth-first adjacent pixel AP41 may be increased, thereby compensating for a difference between the intensity of the pixel signal output from each of the first-first adjacent pixel AP11, the second-first adjacent pixel AP21, and the fourth-first adjacent pixel AP41 and the intensity of the pixel signal output from the normal pixel NP.

Further, each of the first-second adjacent pixel AP12, the second-second adjacent pixel AP22, the third-second adjacent pixel AP32 and fourth-second adjacent pixel AP42 may be adjacent to each of the first-second focus pixel FP12, the second-second focus pixel FP22, the third-second focus pixel FP32 and the fourth-second focus pixel FP42 in a positive first direction DR1.

Referring to FIG. 6 and FIG. 7A to FIG. 7E, the intensity of the pixel signal output from the first-second adjacent pixel AP12 in the R1 area is lower than the intensity of the pixel signal output from the normal pixel NP. The intensity of the pixel signal output from the second-second adjacent pixel AP22 in the R2 area is lower than the intensity of the pixel signal output from the normal pixel NP, but is greater than the intensity of the pixel signal output from the first-second adjacent pixel AP12. The intensity of the pixel signal output from the third-second adjacent pixel AP32 in the R3 area is the same or substantially the same as the intensity of the pixel signal output from the normal pixel NP. The intensity of the pixel signal output from the fourth-second adjacent pixel AP42 in the R4 area is greater than the intensity of the pixel signal output from the normal pixel NP.

Therefore, each of an area S12 of the first-second micro-lens ML12 and an area S22 of the second-second micro-lens ML22 may be larger than the area S8 of the eighth micro-lens ML8. The area S12 of the first-second micro-lens ML12 may be larger than the area S21 of the second-second micro-lens ML22. An area S32 of the third-second micro-lens ML32 may be the same or substantially the same as the area S8 of the eighth micro-lens ML8. An area S42 of the fourth-second micro-lens ML42 may be smaller than the area S8 of the eighth micro-lens ML8. Accordingly, the intensity of the pixel signal output from the first-second adjacent pixel AP12 and the second-second adjacent pixel AP22 may be increased, while the intensity of the pixel signal output from the fourth-second adjacent pixel AP42 may be reduced, thereby compensating for a difference between the intensity of the pixel signal output from each of the first-second adjacent pixel AP12, the second-second adjacent pixel AP22, and the fourth-second adjacent pixel AP42 and the intensity of the pixel signal output from the normal pixel NP.

Similarly, referring to the third contour C3 in FIG. 4, for example, an area S13 of the first-third micro-lens ML13 may be larger than an area S23 of the second-third micro-lens ML23. The area S23 of the second-third micro-lens ML23 may be larger than an area S33 of the third-third micro-lens ML33. The area S33 of the third-third micro-lens ML33 may be larger than an area S43 of the fourth-third micro-lens ML43. Referring to the fourth contour C4 of FIG. 4, for example, an area S14 of the first-4 micro-lens ML14 may be larger than an area S24 of the second-fourth micro-lens ML24. The area S24 of the second-fourth micro-lens ML24 may be larger than an area S34 of the third-fourth micro-lens ML34. The area S34 of the third-fourth micro-lens ML34 may be larger than an area S44 of the fourth-fourth micro-lens ML44. Referring to the fifth contour C5 of FIG. 4, for example, an area S15 of the first-fifth micro-lens ML15 may be smaller than an area S25 of the second-fifth micro-lens ML25. The area S25 of the second-fifth micro-lens ML25 may be smaller than an area S35 of the third-fifth micro-lens ML35. The area S35 of the third-fifth micro-lens ML35 may be smaller than an area S45 of the fourth-fifth micro-lens ML45. Referring to the sixth contour C6 of FIG. 4, for example, an area S16 of the first-sixth micro-lens ML16 may be smaller than an area S26 of the second-sixth micro-lens ML26. The area S26 of the second-sixth micro-lens ML26 may be smaller than an area S36 of the third-sixth micro-lens ML36. The area S36 of the third-sixth micro-lens ML36 may be smaller than an area S46 of the fourth-sixth micro-lens ML46. An area S17 of the first-seventh micro-lens ML17, an area S27 of the second-seventh micro-lens ML27, an area S37 of the third-seventh micro-lens ML37, and an area S47 of the fourth-seventh micro-lens ML7 may be determined with reference to the seventh contour C7 as shown in FIG. 4. An area S18 of the first-eighth micro-lens ML18, an area S28 of the second-eighth micro-lens ML28, an area S38 of the third-eighth micro-lens ML38, and an area S48 of the fourth-eighth micro-lens ML8 may be determined with reference to eighth contour C8 as shown in FIG. 4. An area S19 of the first-ninth micro-lens ML19, an area S29 of the second-ninth micro-lens ML29, an area S39 of the third-ninth micro-lens ML39, and an area S49 of the fourth-ninth micro-lens ML9 may be determined with reference to the ninth contour C9 as shown in FIG. 4. An area S110 of the first-tenth micro-lens ML110, an area S210 of the second-tenth micro-lens ML210, an area S310 of the third-tenth micro-lens ML310, and an area S410 of the fourth-tenth micro-lens ML10 may be determined with reference to tenth contour C10 as shown in FIG. 4.

Referring to FIG. 7A to FIG. 7D, in some example embodiments, an area of each of the first-first to first-tenth micro-lenses ML11 to ML110, the second-first to second-tenth micro-lenses ML21 to ML210, the third-first to third-tenth micro-lenses ML31 to ML310, and the fourth-first to fourth-tenth micro-lenses ML41 to ML410 may vary based on a width thereof in a direction in which each lens is adjacent to the seventh micro-lens ML7. For example, each of a maximum width W11 of the first-first micro-lens ML11 and a maximum width W21 of the second-first micro-lens ML21 in the first direction DR1 may be smaller than a maximum width of the eighth micro-lens ML8 in the first direction DR1. Each of a maximum width W21 of the first-first micro-lens ML11 and a maximum width W22 of the second-first micro-lens ML21 in the second direction DR2 may be equal or substantially equal to a maximum width of the eighth micro-lens ML8 in the second direction DR2. The maximum width W11 of the first-first micro-lens ML11 may be smaller than the maximum width W21 of the second-first micro-lens ML21.

In some example embodiments, an area of each of the first-first to first-tenth micro-lenses ML11 to ML110, the second-first to second-tenth micro-lenses ML21 to ML210, the third-first to third-tenth micro-lenses ML31 to ML310, and the fourth-first to fourth-tenth micro-lenses ML41 to ML410 may vary based on a minimum spacing between each micro-lens and the seventh micro-lens ML7 in a direction in which each micro-lens is adjacent to the seventh micro-lens ML7, or a maximum spacing between each micro-lens and the seventh micro-lens ML7 in the third direction DR3 in which each micro-lens overlaps the seventh micro-lens ML7. The micro-lens may overlap when an outer bound of the shape of the micro-lens which contacts, or would contact, the planarization film 180 intersects another outer bound of a micro-lens.

A minimum spacing D1 between the first-first micro-lens ML11 and the seventh micro-lens ML7 in the first direction DR1 and in the R1 area may be greater than a minimum spacing D2 between the second-first micro-lens ML21 and the seventh micro-lens ML7 in the first direction DR1 and in the R2 area. In still another example, in the R4 area, the fourth-second micro-lens ML42 may be spaced apart from the seventh micro-lens ML7 by a minimum spacing D3 in the first direction DR1. That is, the first-first micro-lens ML11 and the seventh micro-lens ML7 in the R1 area may not contact each other. The second-first micro-lens ML21 and the seventh micro-lens ML7 in the R2 area may not contact each other. The fourth-second micro-lens ML42 and the seventh micro-lens ML7 in the R4 area may not contact each other.

In this connection, the maximum width W11 of the first-first adjacent pixel AP11 in the first direction DR1 may refer to a spacing between a first start point thereof and a first end point adjacent to the first-first focus pixel FP11. A maximum width of the normal pixel NP adjacent to the first-first adjacent pixel AP11 in the first direction DR1 may refer to a spacing between a second start point and a second end point. The second start point may be disposed on a first extension line L1 extending from the first start point in the second direction DR2. The second end point may not be disposed on a second extension line L2 extending from the first end point in the second direction DR2, but may be positionally-biased in a positive first direction DR1 relative to the second extension line L2.

Thus, for example, a top surface of the planarization film 180 between the first-first micro-lens ML11 and the seventh micro-lens ML7 in the R1 area, between the second-first micro-lens ML21 and the seventh micro-lens ML7 in the R2 area, and between the fourth-second micro-lens ML42 and the seventh micro-lens ML7 in the R4 area may be exposed and may be in contact with the second protective film 185. Further, the seventh micro-lens ML7 and the first-second micro-lens ML12 in the R1 area may overlap each other in the third direction DR3. The seventh micro-lens ML7 and the second-second micro-lens ML22 in the R2 area may overlap each other in the third direction DR. The fourth-first micro-lens ML41 and the seventh micro-lens ML7 in the R4 area may overlap each other in the third direction DR3. Accordingly, each of a point where the seventh micro-lens ML7 and the first-second micro-lens ML12 in the R1 area come in contact each other, a point where the seventh micro-lens ML7 and the second-second micro-lens ML22 in the R2 area come into contact with each other, and a point where the fourth-first micro-lens ML41 and the seventh micro-lens ML7 in the R4 area come into contact with each other may be disposed above a top surface of the planarization film 180.

Figure 9:
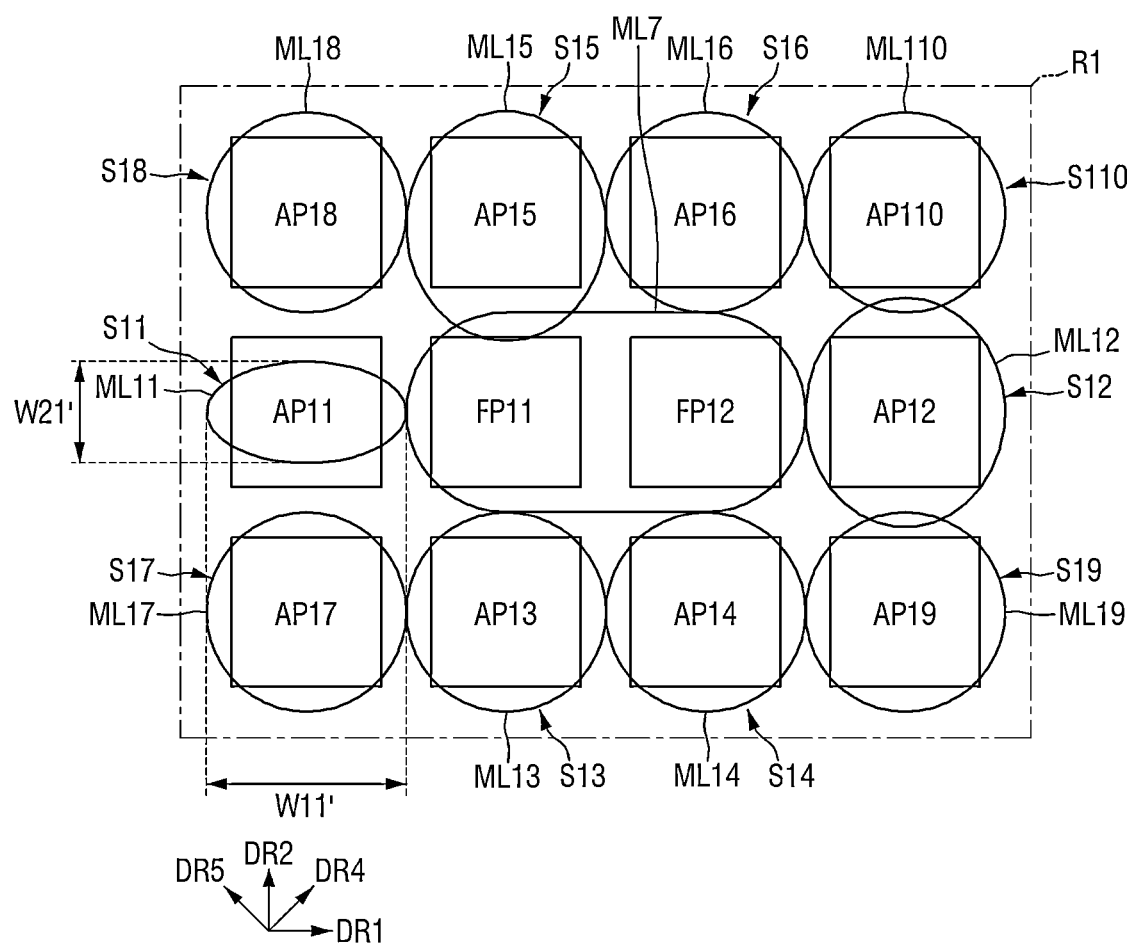
FIGS. 9 and 10 are schematic layout diagrams for a R1 area in FIGS. 5 and 6.
Figure 10:
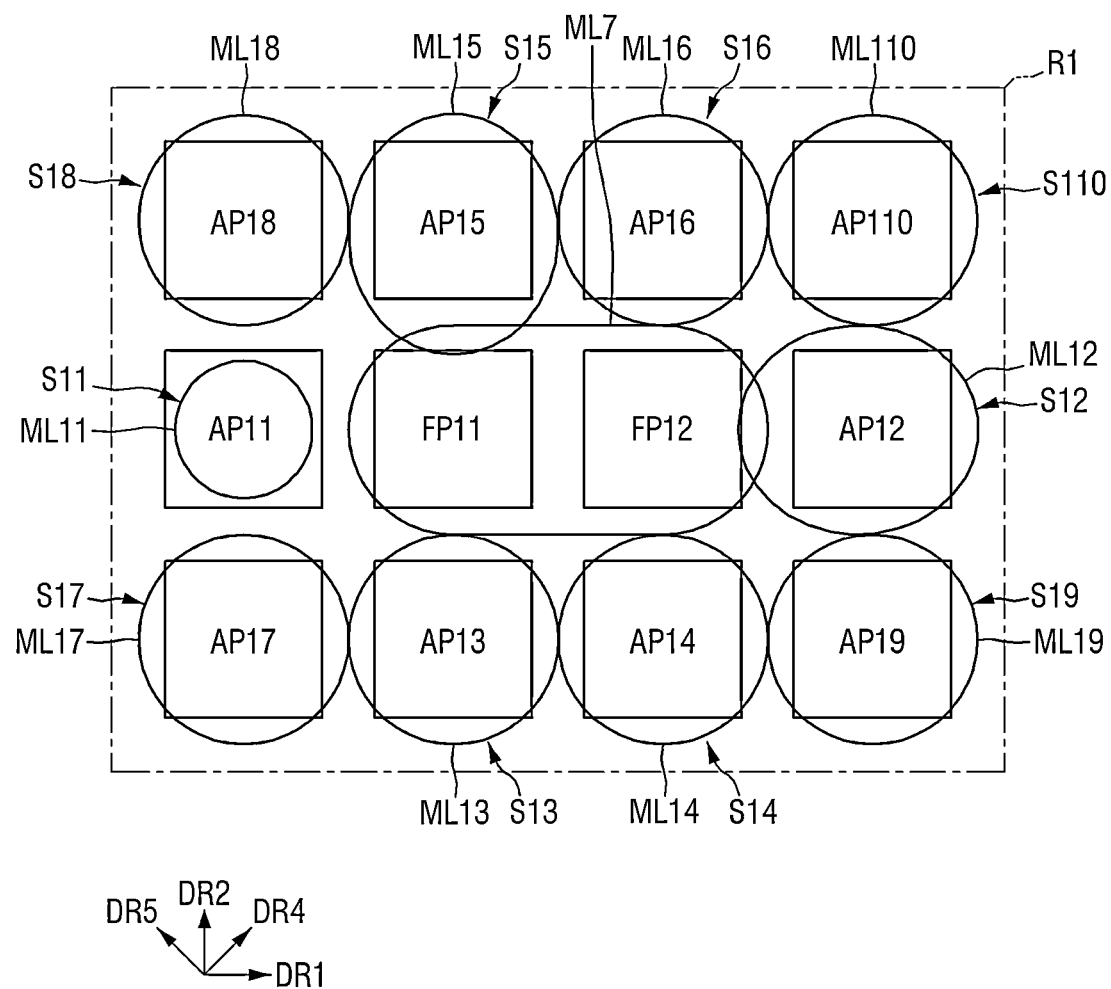

FIGS. 9 and 10 are schematic layout diagrams of the R1 area in FIGS. 5 and 6. For convenience of description, differences from the previous description will be mainly described below.

Referring to FIG. 9, in the image sensor according to some example embodiments, an area of each of the first-first to first-tenth micro-lenses ML11 to ML110 may vary based on a width thereof in a direction intersecting a direction in which each micro-lens is adjacent to the seventh micro-lens ML7. For example, a maximum width W11' of the first-first micro-lens ML11 in the first direction DR1 may be equal or substantially equal to a maximum width of the eighth micro-lens ML8 in the first direction DR1. A maximum width W21' of the first-first micro-lens ML11 in the second direction DR2 may be smaller than a maximum width of the eighth micro-lens ML8 in the second direction DR2. Further, the first-second micro-lens ML12 may overlap, in the third direction DR3, the eighth micro-lens ML8 covering each of the normal pixels NP adjacent to the first-second micro-lens ML12 in the second direction DR2.

Referring to FIG. 10, in the image sensor according to some example embodiments, an area of each of the first-first to first-tenth micro-lenses ML11 to ML110 may vary based on a maximum width thereof in the first direction DR1 and/or the second direction DR2. Further, an outermost point of the first-first micro-lens ML11 in a negative first direction DR1 may be deviated in a positive first direction DR1 from an outermost point in the negative first direction DR1 of the normal pixel NP adjacent to the first-first micro-lens ML11 in the second direction DR2. However, the present disclosure is not limited thereto. An area of each of the first-first to first-tenth micro-lenses ML11 to ML110, the second-first to second-tenth micro-lenses ML21 to ML210, the third-first to third-tenth micro-lenses ML31 to ML310 and the fourth-first to fourth-tenth micro-lenses ML41 to ML410 may vary in various manners.

Figure 11:
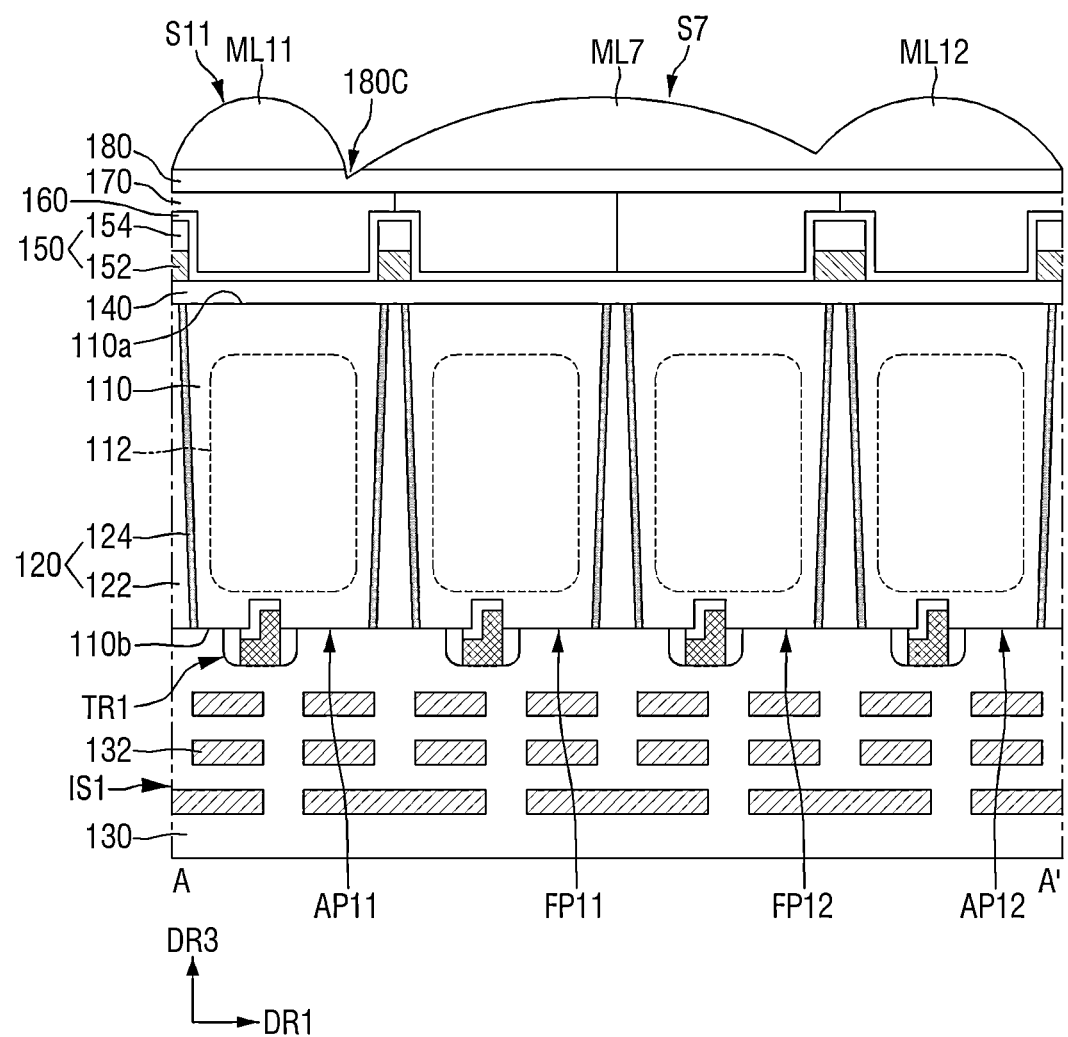
FIG. 11 is a cross-sectional view taken along a line A-A' of a R1 area of FIG. 5 and FIG. 6.

FIG. 11 is a cross-sectional view taken along a line A-A' of the R1 area of FIG. 5 and FIG. 6. For convenience of description, differences from the previous description will be mainly described below.

Referring to FIG. 11, in the image sensor according to some example embodiments, a top surface of the planarization film 180 between the first-first micro-lens ML11 and the seventh micro-lens ML7 may be recessed 180C into the planarization film 180.

Figure 12:
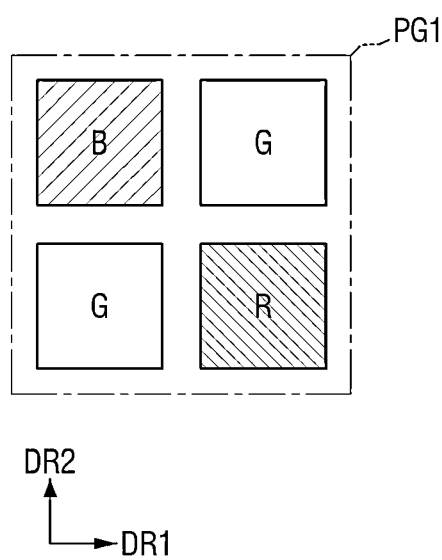
FIG. 12 is a diagram to illustrate a first pixel group of FIG. 3.
Figure 13:
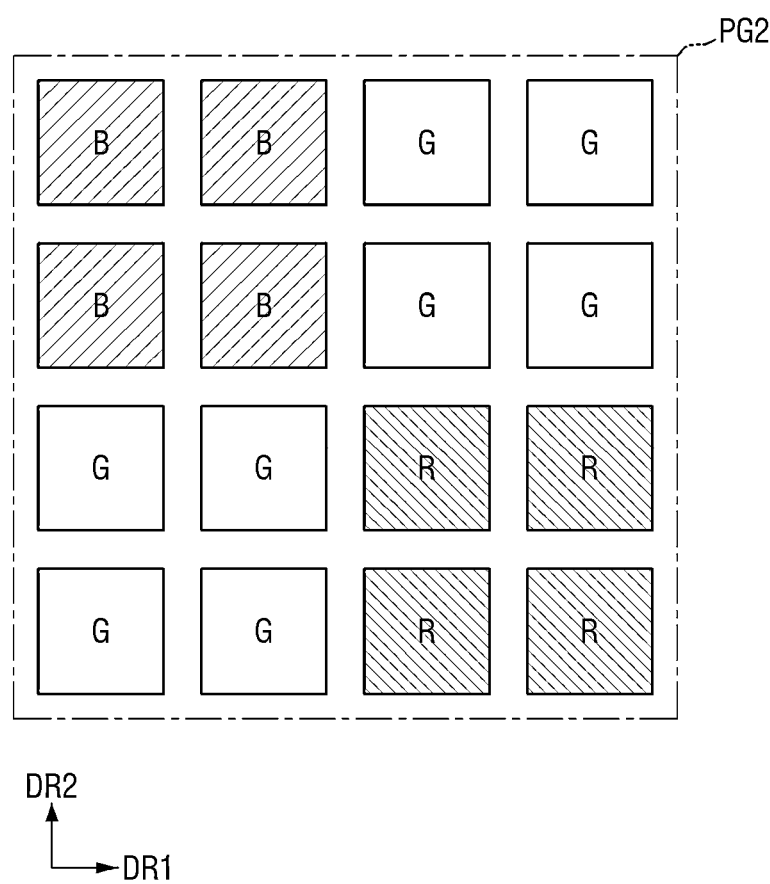
FIG. 13 is a diagram to illustrate a second pixel group of FIG. 3.
Figure 14:
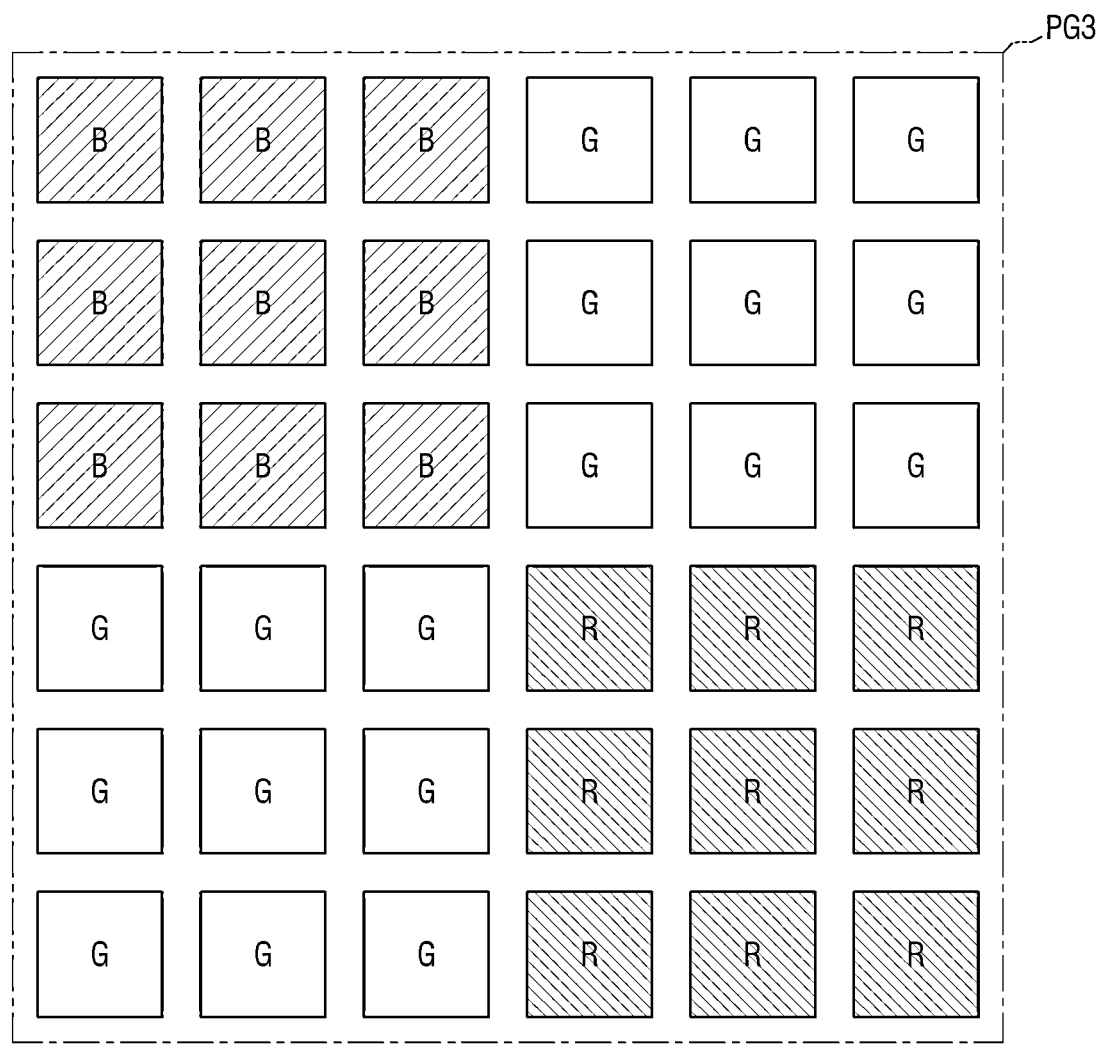
FIG. 14 is a diagram to illustrate a third pixel group of FIG. 3.

FIG. 12 is a diagram to illustrate a first pixel group of FIG. 3. FIG. 13 is a diagram to illustrate a second pixel group of FIG. 3. FIG. 14 is a diagram to illustrate a third pixel group of FIG. 3.

Referring to FIG. 3 and FIG. 12, the pixels of the first pixel group PG1 may be arranged in a bayer pattern form. The group may include a pixel in which a blue color filter B is disposed, a pixel in which a green color filter G is disposed, and a pixel in which a red color filter R is disposed. The pixels having the green color filters G respectively may be arranged in a diagonal direction, that is, in the fourth direction DR4, rather than in the first direction DR1 and the second direction DR2.

Referring to FIG. 3 and FIG. 13, the pixels of the second pixel group PG2 may be arranged in a tetra pattern form. For example, pixels having blue color filters B respectively may be arranged in a 2×2 form. Pixels having green color filters G respectively may be arranged in a 2×2 form. Pixels having red color filters R respectively may be arranged in a 2×2 form. The tetra pattern may be similar to the bayer pattern, with each group of color filters being in a 2×2 form.

Referring to FIG. 3 and FIG. 14, the pixels of the third pixel group PG3 may be arranged in a nona pattern form. For example, pixels having blue color filters B respectively may be arranged in a 3×3 form. Pixels having green color filters G respectively may be arranged in a 3×3 form. Pixels having red color filters R respectively may be arranged in a 3×3 form. The nona pattern may be similar to the bayer pattern, with each group of color filters being in a 3×3 form.

In this connection, each pixel may be one of the plurality of focus pixels FP1 and FP2, the plurality of adjacent pixels AP1 to AP10, and the plurality of normal pixels NP as described above. The color filter may be the color filter 170 of FIG. 8A to FIG. 8E as described above. Further, the present disclosure is not limited thereto. The pixels may be arranged in a hexadeca pattern form in which pixels having blue color filters B respectively may be arranged in a 4×4 form, pixels having green color filters G respectively may be arranged in a 4×4 form, and pixels having red color filters R respectively may be arranged in a 4×4 form.

Figure 15:
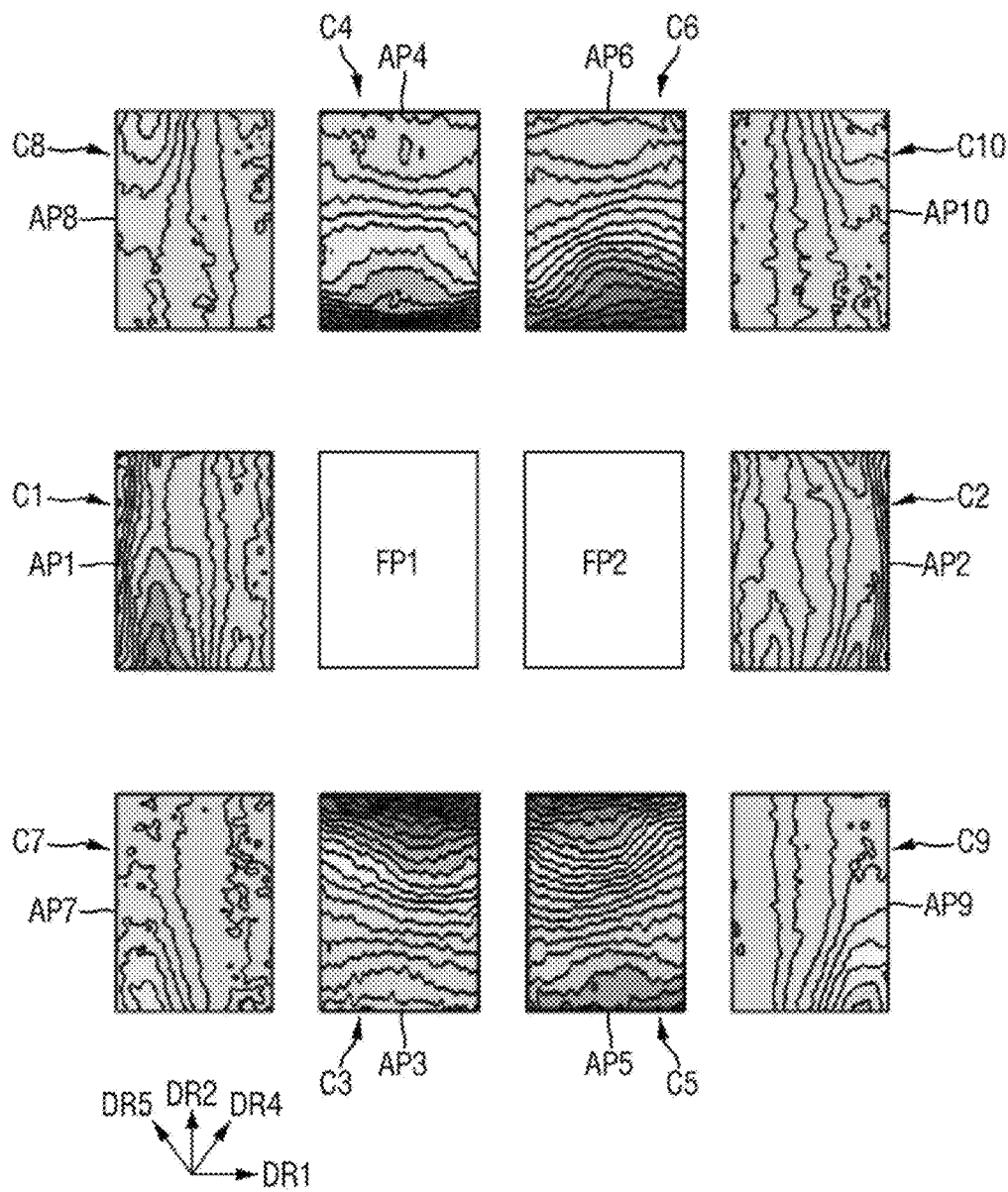
FIG. 15 is a diagram to illustrate a pixel signal of a light-receiving area of FIG. 3.

FIG. 15 is a diagram to illustrate the pixel signal of the light-receiving area of FIG. 3. For convenience of description, differences from the previous description will be mainly described below.

Referring to FIG. 3 and FIG. 15, in the image sensor according to some example embodiments, an area of the micro-lens covering each of the first to tenth adjacent pixels AP1 to AP10 may vary based on each of the first to tenth contours C1 to C10. For example, the intensity of the pixel signal output from the fifth adjacent pixel AP5 increases as a position is father away from the center of the light-receiving area APS in the positive second direction DR2, that is, decreases as a position is closer to the center of the light-receiving area APS in the negative second direction DR2. Thus, an area of the micro-lens covering the fifth adjacent pixel AP5 disposed at the highest level in the positive second direction DR2 in the light-receiving area APS may be smaller than an area of the micro-lens covering the fifth adjacent pixel AP5 disposed at the lowest level in the negative second direction DR2 in the light-receiving area APS.

Figure 16:
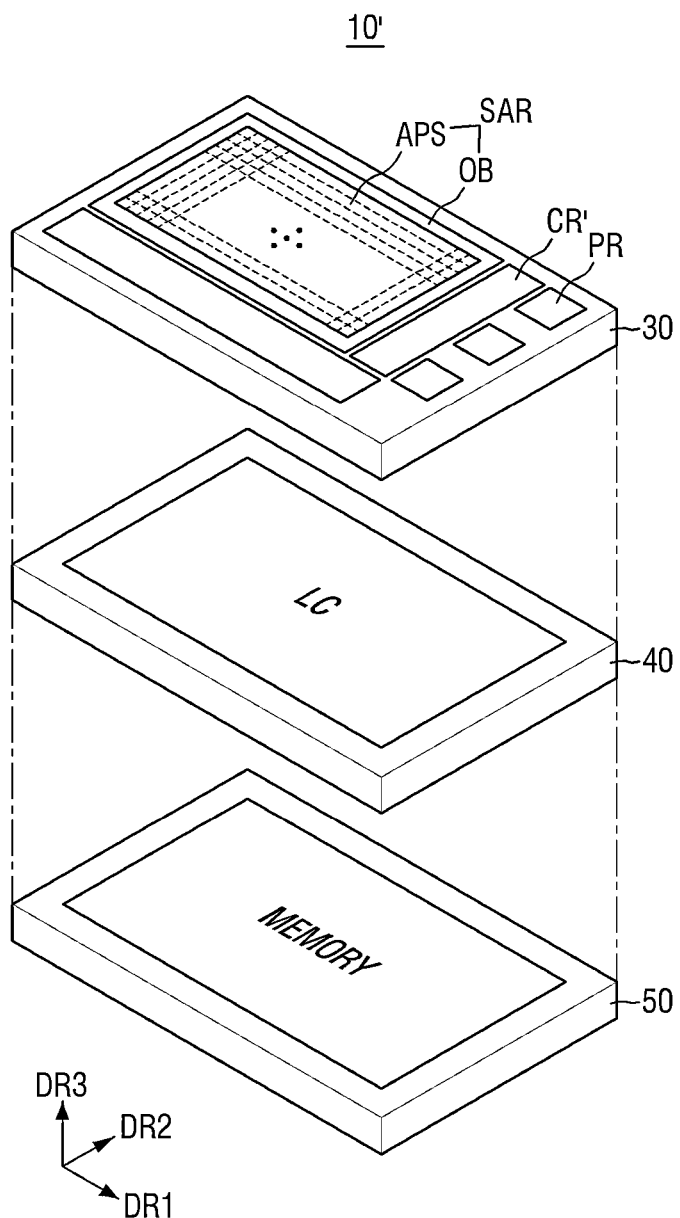
FIG. 16 is a block diagram to illustrate an image sensor according to some example embodiments.

FIG. 16 is a block diagram to illustrate an image sensor according to some example embodiments. For convenience of description, differences from the description using FIG. 2 will be mainly described below.

Referring to FIG. 16, an image sensor 10' may further include a memory chip 50. The memory chip 50, the second or lower chip 40, and the first or upper chip 30 may be stacked sequentially in the third direction DR3. The memory chip 50 may include a memory device. For example, the memory chip 50 may include a volatile memory device such as DRAM or SRAM. The memory chip 50 may receive a signal from the upper chip 30 and the lower chip 40 and process the signal using the memory device.

Figure 17:
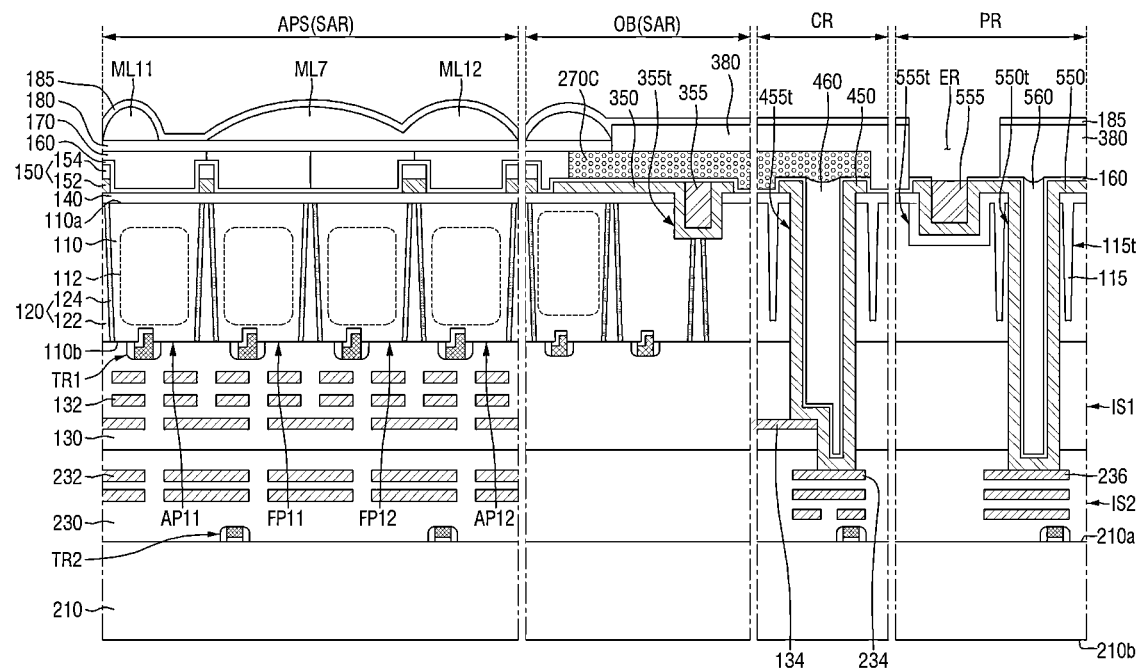
FIG. 17 is a schematic cross-sectional view for illustration of an image sensor according to some example embodiments.

FIG. 17 is a schematic cross-sectional view for illustration of an image sensor according to some example embodiments. For the convenience of description, differences from the previous description will be mainly described below.

Referring to FIG. 17, an image sensor according to some example embodiments may include a sensor array area SAR, a connection area CR, and a pad area PR. The sensor array area SAR, the connection area CR, and the pad area PR may be embodied as the sensor array area SAR, the connection area CR, and the pad area PR of FIG. 2 and FIG. 16, respectively. In FIG. 17, the cross-sectional view of FIG. 8A is shown as a cross-sectional view of the sensor array area SAR by way of example.

In some example embodiments, a first line structure IS1 may include a first line 132 in the sensor array area SAR and a second line 134 in the connection area CR. The first line 132 may be electrically connected to pixels of the sensor array area SAR. For example, the first line 132 may be connected to the first electronic element TR1. At least a portion of the second line 134 may be electrically connected to at least a portion of the first line 132. For example, at least a portion of the second line 134 may extend from the sensor array area SAR. Accordingly, the second line 134 may be electrically connected to pixels of the sensor array area SAR.

In some example embodiments, a second protective film 185 may be further formed on the micro-lenses ML11, ML7, and ML12. The second protective film 185 may extend along a surface of the micro-lens array ML11, ML7, and ML12. The second protective film 185 may extend along a top surface of a planarization film 170 between the first-first micro-lens ML11 and the seventh micro-lens ML7. In some example embodiments, the second protective film 185 may be disposed on the micro-lens array ML11 to ML110, ML21 to ML210, ML31 to ML310, ML41 to ML410, M7, and M8 as previously described.

The second protective film 185 may include an inorganic oxide. For example, the second protective film 185 may include at least one of silicon oxide, titanium oxide, zirconium oxide, hafnium oxide, and combinations thereof. However, the present disclosure is not limited thereto. In some example embodiments, the second protective film 185 may include a low-temperature oxide (LTO).

The second protective film 185 may protect the micro-lens array ML11, ML7, and ML12 from the outside. For example, the second protective film 185 including an inorganic oxide may cover and protect the micro-lens array ML11, ML7, and ML12 including an organic material such as a light-transmissive resin. Further, the second protective film 185 may improve the quality of the image sensor by improving the light condensing efficiency of each of the micro-lenses ML11, ML7, and ML12. For example, the second protective film 185 may fill spaces between the micro-lenses ML11, ML7, and ML12 to reduce reflection, refraction, and scattering of incident light reaching the spaces between the micro-lenses ML11, ML7, and ML12.

The image sensor according to some example embodiments may further include a second substrate 210, a second line structure IS2, a first connection structure 350, a second connection structure 450, a third connection structure 550, an element separation pattern 115, a light-blocking filter 270C, and a third protective film 380.

The second substrate 210 may be made of bulk silicon or SOI (silicon-on-insulator). The second substrate 210 may be a silicon substrate. Alternatively, the second substrate 210 may be made of a material such as silicon germanium, indium antimonide, lead tellurium compound, indium arsenide, indium phosphide, gallium arsenide or gallium antimonide. Alternatively, the second substrate 210 may include a base substrate and an epitaxial layer formed on the base substrate.

The second substrate 210 may include a third surface 210a and a fourth surface 210b opposite to each other. In some example embodiments, the third surface 210a of the second substrate 210 may face toward the second surface 110b of the first substrate 110.

In some example embodiments, a second electronic element TR2 may be formed on the third surface 210a of the second substrate 210. The second electronic element TR2 may be electrically connected to the sensor array area SAR to transmit/receive an electrical signal to and from each pixel of the sensor array area SAR. For example, the second electronic element TR2 may include electronic elements constituting the control register block 11, the timing generator 12, the ramp signal generator 13, the row driver 14, the readout circuit 16 of FIG. 1, and the like.

The second line structure IS2 may be formed on the third surface 210a of the second substrate 210. The second line structure IS2 may be attached to the first line structure IS1. For example, as shown in FIG. 15, a top surface of the second line structure IS2 may be attached to a bottom surface of the first line structure IS1.

The second line structure IS2 may include one or a plurality of lines. For example, the second line structure IS2 may include a second inter-line insulating film 230, and a plurality of lines 232, 234, and 236 in the second inter-line insulating film 230. In FIG. 15, the number of layers of the lines constituting the second line structure IS2 and the arrangement thereof are only exemplary. Thus, the present disclosure is not limited thereto.

At least some of the lines 232, 234, and 236 of the second line structure IS2 may be connected to the second electronic element TR2. In some example embodiments, the second line structure IS2 may include a third line 232 in the sensor array area SAR, a fourth line 234 in the connection area CR, and a fifth line 236 in the pad area PR. In some example embodiments, the fourth line 234 may be an uppermost line among the plurality of lines in the connection area CR. The fifth line 236 may be an uppermost line among the plurality of lines in the pad area PR.

The first connection structure 350 may be formed in the light-blocking area OB. The first connection structure 350 may be formed on the surface insulating film 140 and in the light-blocking area OB. In some example embodiments, the first connection structure 350 may contact the pixel separation pattern 120. For example, a first trench 355t exposing the pixel separation pattern 120 may be formed in the first substrate 110 and the surface insulating film 140 and in the light-blocking area OB. The first connection structure 350 may be formed in the first trench 355t so as to contact a portion of the pixel separation pattern 120 in the light-blocking area OB. In some example embodiments, the first connection structure 350 may extend along a profile of a side surface and a bottom surface of the first trench 355t.

In some example embodiments, the first connection structure 350 may be electrically connected to the conductive filling pattern 122 to apply a ground voltage or a negative voltage to the conductive filling pattern 122. Accordingly, charges resulting from the ESD may be discharged to the first connection structure 350 via the conductive filling pattern 122. Thus, the ESD bruise defects may be effectively prevented, or the occurrence of may be reduced.

The second connection structure 450 may be formed in the connection area CR. The second connection structure 450 may be formed on the surface insulating film 140 and in the connection area CR. The second connection structure 450 may electrically connect the first substrate 110 and the second substrate 210 to each other. For example, a second trench 455t exposing the second line 134 and the fourth line 234 may be formed in the first substrate 110, the first line structure IS1, and the second line structure IS2 and in the connection area CR. The second connection structure 450 may be formed in the second trench 455t to connect the second line 134 and the fourth line 234 to each other. In some example embodiments, the second connection structure 450 may extend along a profile of a side surface and a bottom surface of the second trench 455t.

The third connection structure 550 may be formed in the pad area PR. The third connection structure 550 may be formed on the surface insulating film 140 and in the pad area PR. The third connection structure 550 may be electrically connected to the second substrate 210 and an external device.

For example, a third trench 550t exposing the fifth line 236 may be formed in the first substrate 110, the first line structure IS1, and the second line structure IS2 and in the pad area PR. The third connection structure 550 may be formed in the third trench 550t and contact the fifth line 236. Further, in a portion of the first substrate 110 in the pad area PR, a fourth trench 555t may be formed. The third connection structure 550 may be formed in the fourth trench 555t so as to be exposed. In some example embodiments, the third connection structure 550 may extend along a profile of a side surface and a bottom surface of each of the third trench 550t and the fourth trench 555t.

Each of the first connection structure 350, the second connection structure 450 and the third connection structure 550 may include, for example, at least one of titanium (Ti), titanium nitride (TiN), tantalum (Ta), tantalum nitride (TaN), tungsten (W), aluminum (Al), copper (Cu), and combinations thereof. However, the present disclosure is not limited thereto. In some example embodiments, the first connection structure 350, the second connection structure 450, and the third connection structure 550 may be formed at the same level or substantially the same level. In this specification, "being formed at substantially the same level" means being formed using the same manufacturing process.

In some example embodiments, a first pad 355 filling the first trench 355t may be formed on the first connection structure 350. In some example embodiments, on the third connection structure 550, a second pad 555 filling the fourth trench 555t may be formed. Each of the first pad 355 and the second pad 555 may include, for example, at least one of tungsten (W), copper (Cu), aluminum (Al), gold (Au), silver (Ag), and alloys thereof. However, the present disclosure is not limited thereto. In some example embodiments, the first pad 355 and the second pad 555 may be formed at the same level or substantially the same level.

In some example embodiments, a first filling insulating film 460 filling the second trench 455t may be formed on the second connection structure 450. In some example embodiments, a second filling insulating film 560 filling the third trench 550t may be formed on the third connection structure 550. Each of the first filling insulating film 460 and the second filling insulating film 560 may include, for example, at least one of silicon oxide, aluminum oxide, tantalum oxide, and combinations thereof. However, the present disclosure is not limited thereto. In some example embodiments, the first filling insulating film 460 and the second filling insulating film 560 may be formed at the same level or substantially the same level.

In some example embodiments, the first protective film 160 may cover the first connection structure 350, the first pad 355, the second connection structure 450, and the third connection structure 550. For example, the first protective film 160 may conformally extend along a profile of each of the first connection structure 350, the first pad 355, the second connection structure 450, and the third connection structure 550. In some example embodiments, the first protective film 160 may expose the second pad 555.

The element separation pattern 115 may be formed in the first substrate 110. For example, an element separation trench 115t may be formed in the first substrate 110. The element separation pattern 115 may be formed in the element separation trench 115t. In some example embodiments, the element separation pattern 115 may extend from the first surface 110a of the first substrate 110. In some example embodiments, the element separation pattern 115 may be spaced apart from the second surface 110b of the first substrate 110.

Figure 18:
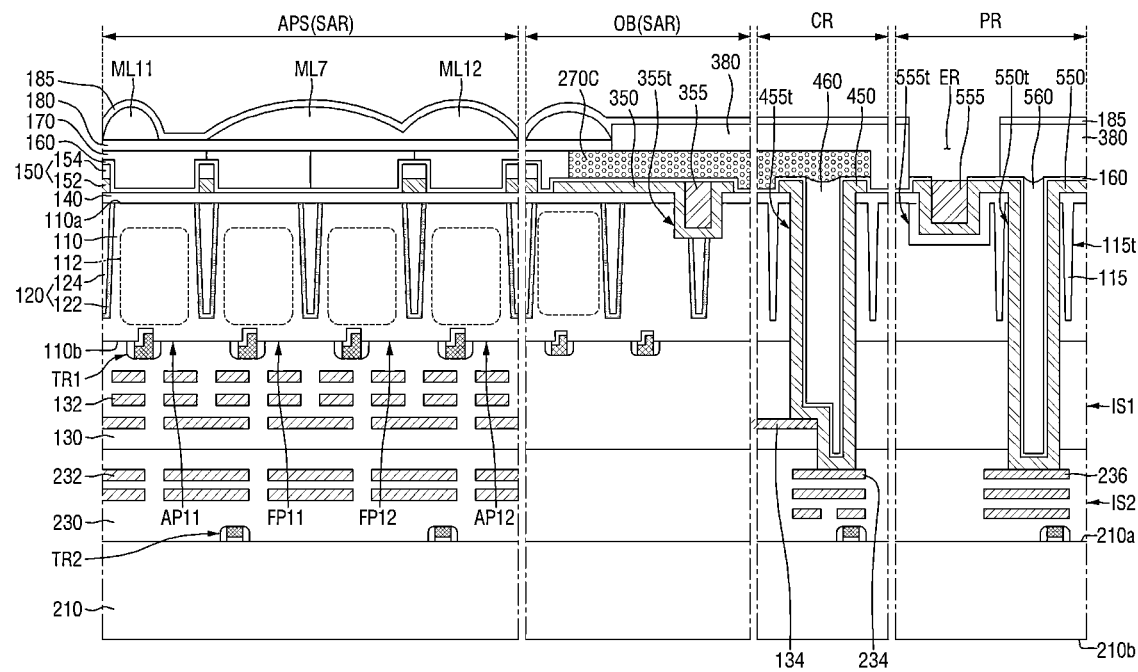
FIG. 18 is a schematic cross-sectional view to illustrate an image sensor according to some example embodiments.

FIG. 18 is a schematic cross-sectional view to illustrate an image sensor according to some example embodiments. For convenience of description, differences from the description using FIG. 17 will be mainly described below.

Referring to FIG. 18, in the image sensor according to some example embodiments, a width of the pixel separation pattern 120 may increase as the pattern extends away from the second surface 110b of the first substrate 110. This may be due to the characteristics of the etching process for forming the pixel separation pattern 120. For example, a process of etching the first substrate 110 to form the pixel separation pattern 120 may be performed on the first surface 110a of the first substrate 110.

In some example embodiments, the pixel separation pattern 120 may not completely extend through the first substrate 110. For example, the pixel separation pattern 120 may extend from the first surface 110a of the first substrate 110 but not to the second surface 110b of the first substrate 210. That is, the lowermost surface of the pixel separation pattern 120 may be disposed in the first substrate 110.

Figure 19:
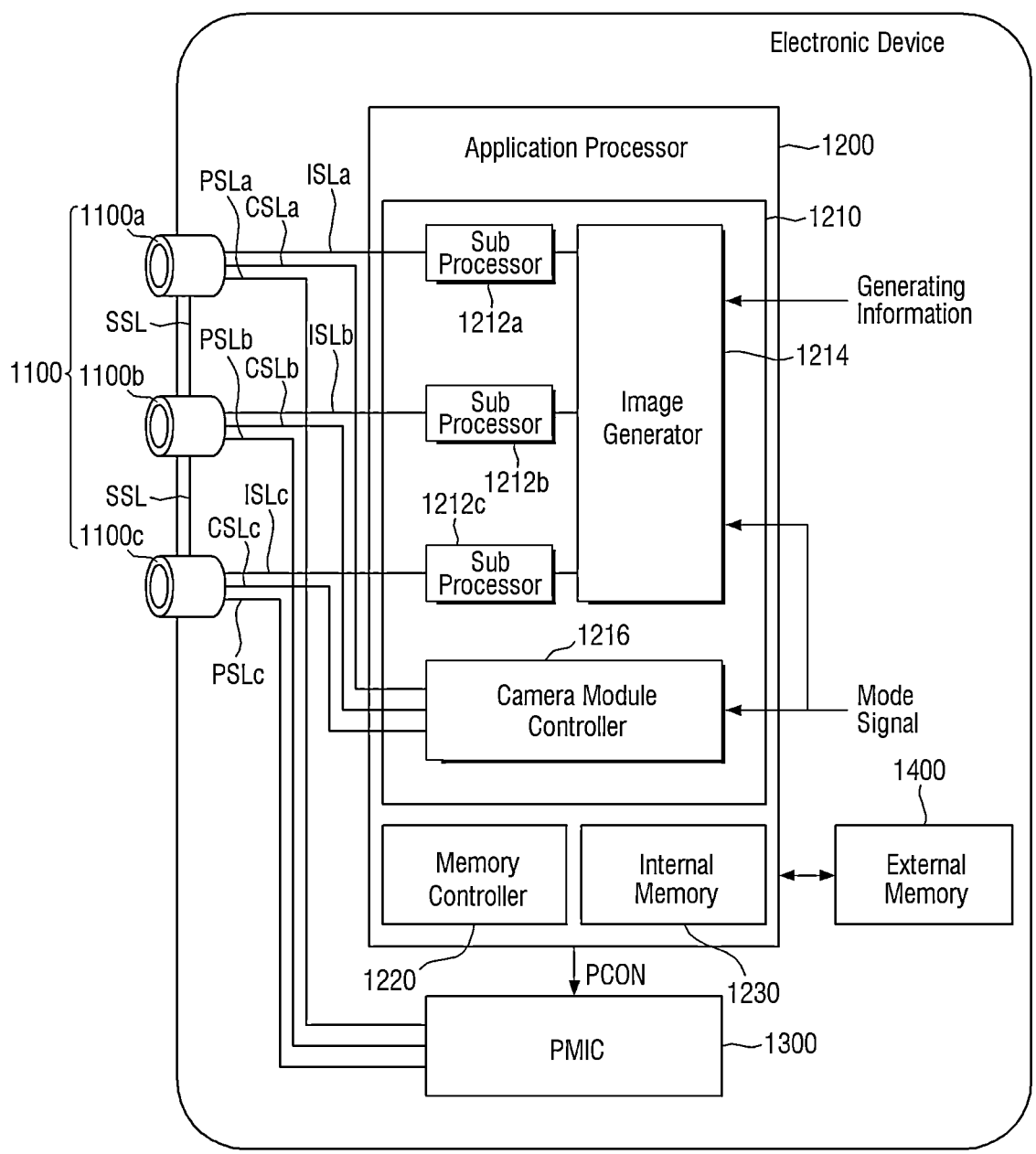
FIG. 19 is a block diagram of an electronic device including a multi-camera module.
Figure 20:
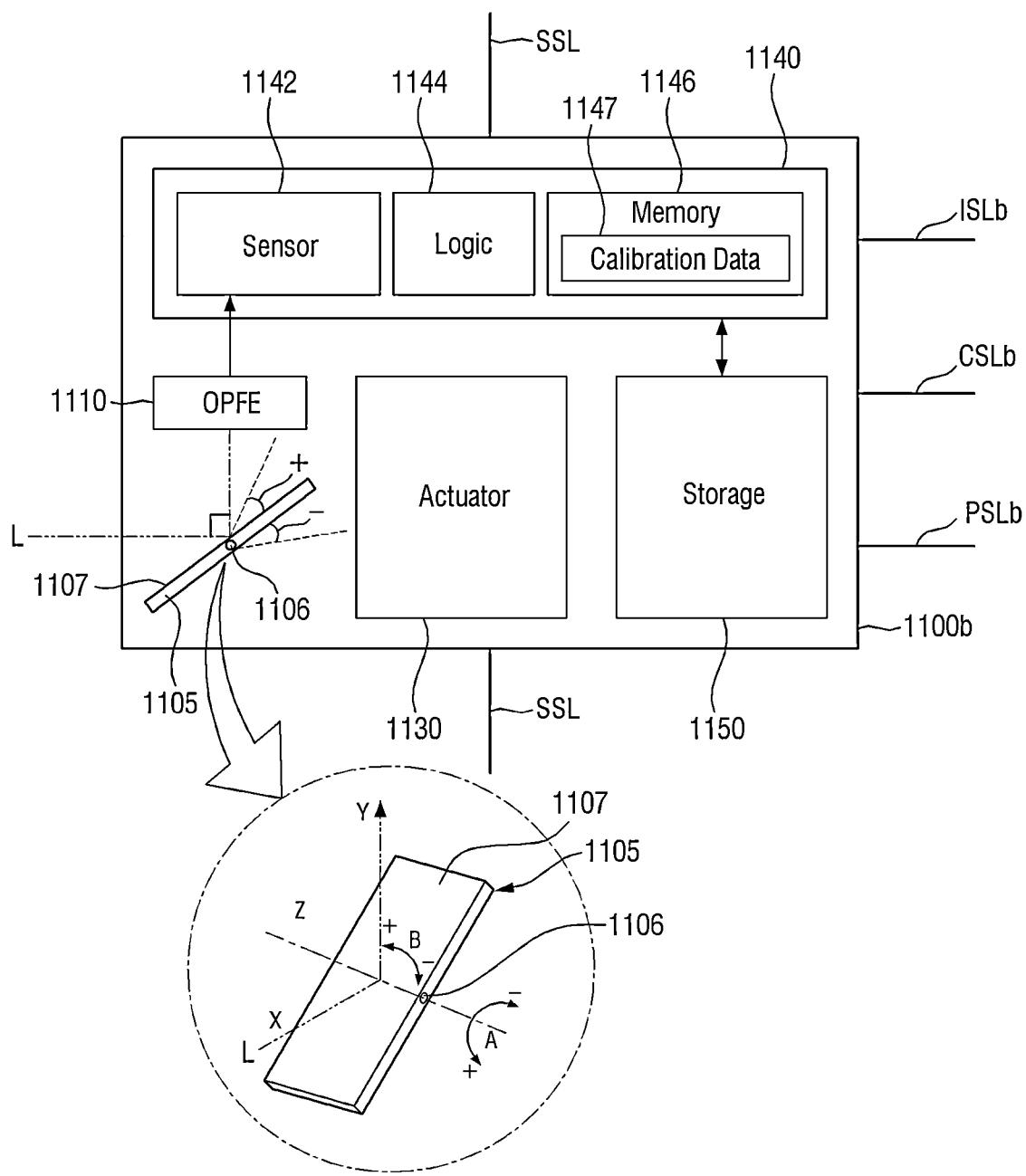
FIG. 20 is a detailed block diagram of a camera module of FIG. 19.

FIG. 19 is a block diagram of an electronic device including a multi-camera module. FIG. 20 is a detailed block diagram of a camera module of FIG. 19.

Referring to FIG. 19, an electronic device 1000 may include a camera module group 1100, an application processor 1200, a PMIC 1300 and an external memory 1400.

The camera module group 1100 may include a plurality of camera modules 1100a, 1100b, and 1100c. Although the drawing shows some example embodiments in which the three camera modules 1100a, 1100b, and 1100c are arranged, example embodiments of the present disclosure is not limited thereto. In some example embodiments, the camera module group 1100 may be modified to include only two camera modules. Further, in some example embodiments, the camera module group 1100 may be modified to include n camera modules (n being a natural number equal to or greater than 4).

Hereinafter, with reference to FIG. 20, a detailed configuration of the camera module 1100b will be described more specifically. A following description may be equally applied to other camera modules 1100a and 1100c depending on some example embodiments.

Referring to FIG. 20, the camera module 1100b may include a prism 1105, an optical path folding element (hereinafter, "OPFE") 1110, an actuator 1130, an image sensing device 1140, and a storage 1150.

The prism 1105 may include a reflective surface 1107 made of a light reflective material, and thus may change a path of light L incident from the outside.

In some example embodiments, the prism 1105 may change the path of light L incident in the first direction X into the second direction Y perpendicular to the first direction X. Further, the prism 1105 may rotate the reflective surface 1107 made of the light reflective material around a center axis 1106 in an A direction or may rotate the center axis 1106 in a B direction so that the path of the light L incident in the first direction X may be changed to the second direction Y perpendicular thereto. In this connection, the OPFE 1110 may move in a third direction Z perpendicular to a plane including the first direction X and the second direction Y.

In some example embodiments, as shown, a maximum rotation angle in the A direction of the prism 1105 may be smaller than or equal to about or exactly 15 degrees in a plus (+) A direction, and may be greater than about or exactly 15 degrees in a minus (−) A direction. However, example embodiments of the present disclosure is not limited thereto.

In some example embodiments, the prism 1105 may move by a range about or exactly 20 degrees, or between about or exactly 10 and about or exactly 20 degrees, or between about or exactly 15 and about or exactly 20 degrees in the plus (+) or minus (−) B direction. In this connection, the prism 1105 may move by the same angle in the plus (+) and minus (−) B directions. Alternatively, angles by which the prism 1105 may move in the plus (+) and minus (−) B directions, respectively may have a difference of about or exactly 1 degree therebetween.

In some example embodiments, the prism 1105 may move the reflective surface 1106 made of the light reflective material in the third direction, for example, the Z direction parallel to an extension direction of the center axis 1106.

The OPFE 1110 may include a group of m optical lens (m being a natural number). The group of m optical lenses may move in the second direction Y to change an optical zoom ratio of the camera module 1100b. For example, a basic optical zoom ratio of the camera module 1100b may be Z. When the m optical lenses included in the OPFE 1110 move, the optical zoom ratio of the camera module 1100b may be changed to an optical zoom ratio equal to or higher than 3Z or 5Z.

The actuator 1130 may move the OPFE 1110 or the optical lens to a specific position. For example, the actuator 1130 may adjust a position of the optical lens so that the image sensor 1142 is located at a focal length of the optical lens for accurate sensing.

The image sensing device 1140 may include an image sensor 1142, a control logic 1144 and a memory 1146. The image sensor 1142 may sense an image of a sensing target using the light L provided through the optical lens. The control logic 1144 may control all of operations of the camera module 1100b. For example, the control logic 1144 may control an operation of the camera module 1100b based on a control signal provided through a control signal line CSLb.

The memory 1146 may store therein information necessary (or beneficial or useful) for the operation of the camera module 1100b, such as calibration data 1147. The calibration data 1147 may include information required when the camera module 1100b generates image data using the light L provided from the outside. The calibration data 1147 may include, for example, information about a degree of rotation, information about a focal length, information about an optical axis, and the like, as described above. When the camera module 1100b is implemented in a multi-state camera form in which the focal length varies based on a position of the optical lens, the calibration data 1147 may include a focal length value based on each position (or each state) of the optical lens, and information related to auto focusing.

The storage 1150 may store therein image data sensed via the image sensor 1142. The storage 1150 may be disposed outside the image sensing device 1140, and may be implemented to be stacked on a sensor chip constituting the image sensing device 1140. In some example embodiments, the storage 1150 may be embodied as an EEPROM (Electrically Erasable Programmable Read-Only Memory). However, example embodiments of the present disclosure is not limited thereto.

Referring to FIG. 19 and FIG. 20 together, in some example embodiments, each of the plurality of camera modules 1100a, 1100b, and 1100c may include each actuator 1130. Accordingly, each of the plurality of camera modules 1100a, 1100b, and 1100c may include the same or different calibration data 1147 based on an operation of the actuator 1130 included therein.

In some example embodiments, one camera module (e.g., 1100b) among the plurality of camera modules 1100a, 1100b, and 1100c may be a camera module in a folded lens form including the prism 1105 and the OPFE 1110 as described above, while each of the remaining camera modules (e.g., 1100a and 1100c) may be a vertical type camera module that does not include the prism 1105 and the OPFE 1110. However, example embodiments are not limited thereto.

In some example embodiments, one camera module (e.g., 1100c) among the plurality of camera modules 1100a, 1100b, and 1100c, may be a depth camera of a vertical form that extracts depth information, for example, using IR (Infrared Ray). In this case, the application processor 1200 may merge image data provided from the depth camera and image data provided from another camera module (e.g., 1100a or 1100b) to generate a three-dimensional depth image (3D depth image).

In some example embodiments, at least two (e.g., 1100a and 1100b) of the plurality of camera modules 1100a, 1100b, and 1100c may have different FOVs (Field of Views). In this case, for example, at least two of the plurality of camera modules 1100a, 1100b, and 1100c, for example, optical lenses of at least two (e.g., 1100a and 1100b) of the plurality of camera modules 1100a, 1100b, and 1100c may be different from each other. However, the present disclosure is not limited thereto.

Further, in some example embodiments, FOVs of the plurality of camera modules 1100a, 1100b, and 1100c may be different from each other. In this case, the optical lenses respectively included in the plurality of camera modules 1100a, 1100b, and 1100c may also be different from each other. However, the present disclosure is not limited thereto.

In some example embodiments, the plurality of camera modules 1100a, 1100b, and 1100c may be physically separated from each other. That is, instead of a scheme in which a sensing area of one image sensor 1142 are divided into a plurality of sub-areas which correspond to the plurality of camera modules 1100a, 1100b, and 1100c, a scheme in which an individual image sensor 1142 may be disposed in each of the plurality of camera modules 1100a, 1100b, and 1100c may be employed.

Referring back to FIG. 19, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented as separate semiconductor chips separated from each other.

The image processing device 1210 may include a plurality of auxiliary image processors 1212a, 1212b, and 1212c, an image generator 1214 and a camera module controller 1216.

The number of the auxiliary image processors 1212a, 1212b, and 1212c may correspond to the number of camera modules 1100a, 1100b, and 1100c.

Image data generated from each of the camera modules 1100a, 1100b, and 1100c may be provided to each of the auxiliary image processors 1212a, 1212b, and 1212c via each of image signal lines ISLa, ISLb, and ISLc separated from each other. For example, the image data generated from the camera module 1100a may be transmitted to the auxiliary image processor 1212a via the image signal line ISLa. The image data generated from the camera module 1100b may be transmitted to the auxiliary image processor 1212b via the image signal line ISLb. The image data generated from the camera module 1100c may be transmitted to the auxiliary image processor 1212c via the image signal line ISLc. The image data transmission may be performed, for example, using a camera serial interface (CSI) based on a MIPI (Mobile Industry Processor Interface). However, example embodiments of the present disclosure are not limited thereto.

In some example embodiments, one auxiliary image processor may correspond to a plurality of camera modules. For example, the auxiliary image processor 1212a and the auxiliary image processor 1212c may not be implemented separately from each other as shown, but may be integrated into one auxiliary image processor. The image data provided from the camera module 1100a and the camera module 1100c may be selected via a selection element, for example, a multiplexer, and then may be provided to the integrated auxiliary image processor.

The image data provided to each of the auxiliary image processors 1212a, 1212b, and 1212c may be provided to the image generator 1214. The image generator 1214 may generate an output image using the image data provided from each of the auxiliary image processors 1212a, 1212b, and 1212c and based on image generation information or a mode signal.

Specifically, the image generator 1214 may merge at least a portion of the image data generated from the camera modules 1100a, 1100b, and 1100c having different FOVs, and based on the image generation information or the mode signal, and thus may generate the output image as the merging result. Further, the image generator 1214 may select one of the image data generated from the camera modules 1100a, 1100b, and 1100c having different FOVs, and based on the image generation information or the mode signal and thus may generate the output image as the selected data.

In some example embodiments, the image generation information may include a zoom signal or a zoom factor. Further, in some example embodiments, the mode signal may be, for example, a signal based on a mode selected by a user.

When the image generation information is the zoom signal or the zoom factor, and the camera modules 1100a, 1100b, and 1100c have different FOVs, the image generator 1214 may perform different operations based on types of the zoom signal. For example, when the zoom signal is a first signal, the image generator may merge the image data output from the camera module 1100a and the image data output from the camera module 1100c with each other, and generate the output image using the merged image data, and the image data output from the camera module 1100b not used in the merging operation. When the zoom signal is a second signal different from the first signal, the image generator 1214 may not perform such an image data merging operation, but may select one of the image data output from the camera modules 1100a, 1100b, and 1100c and may generate the selected data as the output image. However, example embodiments are not limited thereto and schemes for processing the image data may be modified as needed or desired.

In some example embodiments, the image generator 1214 may receive a plurality of image data having different exposure times from at least one of the plurality of auxiliary image processors 1212a, 1212b, and 1212c, and may perform HDR (high dynamic range) processing on the received plurality of image data, thereby generating merged image data having an increased dynamic range.

The camera module controller 1216 may provide a control signal to each of the camera modules 1100a, 1100b, and 1100c. The control signal generated from the camera module controller 1216 may be provided to a corresponding one of the camera modules 1100a, 1100b, and 1100c via a corresponding one of the control signal lines CSLa, CSLb, and CSLc separated from each other.

One of the plurality of camera modules 1100a, 1100b, and 1100c may be designated as a master camera (e.g., 1100b) based on the image generation information including the zoom signal or the mode signal, while each of the remaining camera modules (e.g., 1100a and 1100c) may be designated as a slave camera. This designation information may be included in the control signal and may be provided to a corresponding one of the camera modules 1100a, 1100b, and 1100c via a corresponding one of the control signal lines CSLa, CSLb, and CSLc separated from each other.

The camera module acting as the master or slave camera may vary based on the zoom factor or an operation mode signal. For example, when the FOV of the camera module 1100a is larger than that of the camera module 1100b, and the zoom factor indicates a low zoom ratio, the camera module 1100b may act as a master camera, while the camera module 1100a may act as a slave camera. Conversely, when the zoom factor indicates a high zoom ratio, the camera module 1100a may act as a master camera, while the camera module 1100b may act as a slave camera.

In some example embodiments, the control signal from the camera module controller 1216 provided to each of the camera modules 1100a, 1100b, and 1100c may include a sync enable signal. For example, when the camera module 1100b is the master camera, and each of the camera modules 1100a and 1100c is the slave camera, the camera module controller 1216 may transmit the sync enable signal to the camera module 1100b. Upon receiving such a sync enable signal, the camera module 1100b may generate a sync signal based on the provided sync enable signal, and may provide the generated sync signal to the camera modules 1100a and 1100c via a sync signal line SSL. The camera module 1100b and the camera modules 1100a and 1100c may transmit the image data to the application processor 1200 while the camera module 1100b and the camera modules 1100a and 1100c are synchronized with each other using the sync signal.

In some example embodiments, the control signal from the camera module controller 1216 provided to each of the plurality of camera modules 1100a, 1100b, and 1100c may include mode information according to the mode signal. Based on this mode information, the plurality of camera modules 1100a, 1100b, and 1100c may operate in a first operation mode or a second operation mode in relation to a sensing speed.

In the first operation mode, the plurality of camera modules 1100a, 1100b, and 1100c may generate an image signal at a first speed (for example, may generate an image signal at a first frame rate), may encode the image signal at a second speed higher than the first speed (for example, encode the image signal at a second frame rate higher than the first frame rate) and may transmit the encoded image signal to the application processor 1200. In this connection, the second speed may be lower than or equal to 30 times of the first speed.

The application processor 1200 may store the received image signal, that is, the encoded image signal, in the memory 1230 provided therein, or a storage 1400 external to the application processor 1200, and then, read and decode the encoded image signal from the memory 1230 or the storage 1400, and then, display image data generated based on the decoded image signal. For example, a corresponding auxiliary processor among the plurality of auxiliary processors 1212a, 1212b, and 1212c of the image processing device 1210 may perform the decoding, and may perform the image processing on the decoded image signal.

In the second operation mode, the plurality of camera modules 1100a, 1100b, and 1100c may generate an image signal at a third speed lower than the first speed (for example, generate an image signal at a third frame rate lower than the first frame rate), and then transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, for example, a power supply voltage to each of the plurality of camera modules 1100a, 1100b, and 1100c. For example, the PMIC 1300 may supply first power to the camera module 1100a through a first power signal line PSLa, supply second power to the camera module 1100b through a second power signal line PSLb, and supply third power to the camera module 1100c through a third power signal line PSLc, under control of the application processor 1200.

The PMIC 1300 may generate power corresponding to each of the plurality of camera modules 1100a, 1100b, and 1100c and adjust a power level, in response to a power control signal PCON from the application processor 1200. The power control signal PCON may include an operation mode-based power adjustment signal for the plurality of camera modules 1100a, 1100b, and 1100c. For example, the operation mode may include a low power mode and a low power mode. In this connection, the power control signal PCON may include information about a camera module operating in the low power mode and a set power level. Levels of powers provided to the plurality of camera modules 1100a, 1100b, and 1100c may be the same as or different from each other. Further, the level of the power may vary dynamically.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The image signal processor 20 (or other circuitry, for example, the timing generator 12, control register block 11, RAMP signal generator 13, row driver 14, readout circuit 16, buffer 17, electronic device 1000, application processor 1200, image generator 1214, camera module controller 1216, memory controller 1220, PMIC 1300, camera 1100a (1100b, 1100c, etc.), or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although the example embodiments of the present disclosure have been described in more detail with reference to the accompanying drawings, the present disclosure is not necessarily limited to these example embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An image sensor comprising:
different first and second focus pixel pairs in a substrate;
a first adjacent pixel in the substrate and adjacent to the first focus pixel pair in a positive first direction, a pixel being absent between the first focus pixel pair and the first adjacent pixel;
a first micro-lens covering the first adjacent pixel;
a second adjacent pixel in the substrate and adjacent to the second focus pixel pair in the positive first direction, a pixel being absent between the second focus pixel pair and the second adjacent pixel; and
a second micro-lens covering the second adjacent pixel and an area of the first micro-lens being different from an area of the second micro-lens, the first and second micro-lenses having coplanar bottommost surfaces.

2. The image sensor of claim 1, wherein
a maximum width of the first micro-lens in the first direction is a first width,
a maximum width of the second micro-lens in the first direction is a second width, and
the first width is different from the second width.

3. The image sensor of claim 1, wherein
a maximum width of the first micro-lens in a second direction intersecting the first direction is a third width,
a maximum width of the second micro-lens in the second direction is a fourth width, and
the third width is different from the fourth width.

4. The image sensor of claim 1, wherein the image sensor further comprises
a first normal pixel in the substrate, adjacent to the first adjacent pixel in the first direction, and not adjacent to the first focus pixel pair in the first direction and in the second direction;
a third micro-lens covering the first normal pixel, wherein
a maximum width of the first micro-lens in the first direction is a spacing between a first start point and a first end point, a maximum width of the third micro-lens in the first direction is a spacing between a second start point and a second end point, the first end point is facing towards the first focus pixel pair, the second start point is opposite to the first start point in the first direction and is on a first extension line extending from the first start point in a second direction intersecting the first direction, and the second end point is opposite to the first end point in the positive first direction and is not on a second extension line extending from the first end point in the first direction.

5. The image sensor of claim 1, wherein the image sensor further comprises:

a third adjacent pixel in the substrate and adjacent to the first focus pixel pair in a positive second direction intersecting the first direction;

a third micro-lens covering the third adjacent pixel;

a fourth adjacent pixel in the substrate and adjacent to the second focus pixel pair in the positive second direction; and a fourth micro-lens covering the fourth adjacent pixel, wherein a pixel is absent between the first focus pixel pair and the third adjacent pixel, a pixel is absent between the second focus pixel pair and the fourth adjacent pixel, and an area of the third micro-lens is different from an area of the fourth micro-lens.

6. The image sensor of claim 1, wherein the image sensor further comprises:

a first normal pixel in the substrate and spaced apart from the first focus pixel pair via the first adjacent pixel in the first direction; and a third micro-lens covering the first normal pixel, wherein the area of the first micro-lens is equal to an area of the third micro-lens.

7. The image sensor of claim 1, wherein the image sensor further comprises:

a first normal pixel in the substrate and spaced apart from the first focus pixel pair by the first adjacent pixel in the first direction; and a third micro-lens covering the first normal pixel, wherein the area of the first micro-lens is larger than an area of the third micro-lens.

8. The image sensor of claim 1, wherein the image sensor further comprises:

a first normal pixel in the substrate and spaced apart from the first focus pixel pair by the first adjacent pixel in the first direction; and a third micro-lens covering the first normal pixel, wherein the area of the first micro-lens is smaller than an area of the third micro-lens.

9. The image sensor of claim 1, wherein the first focus pixel pair includes a first-first focus pixel and a first-second focus pixel adjacent to each other, the second focus pixel pair includes a second-first focus pixel and a second-second focus pixel adjacent to each other, a pixel is absent between the first-first focus pixel and the first-second focus pixel, and between the second-first focus pixel and the second-second focus pixel, the image sensor further comprises a grid pattern, the grid pattern is on the substrate and between the first adjacent pixel and the first focus pixel pair and between the second adjacent pixel and the second focus pixel pair, and the grid pattern is not on the substrate and between the first-first focus pixel and the first-second focus pixel, and between the second-first focus pixel and the second-second focus pixel.

10. The image sensor of claim 5, wherein the image sensor further comprises:

a fifth micro-lens covering the first focus pixel pair;

a sixth micro-lens covering the second focus pixel pair;

a color filter layer on the first adjacent pixel, the second adjacent pixel, the first focus pixel pair, and the second focus pixel pair; and a planarization film between the color filter layer and the first, second, fifth and sixth micro-lenses, wherein the first micro-lens and the fifth micro-lens do not contact each other on the planarization film.

11. The image sensor of claim 10, wherein at least a portion of the planarization film exposed through a space between the first micro-lens and the second micro-lens is recessed into the planarization film.

12. An image sensor comprising:

a substrate including a first surface on which light is incident, and a second surface opposite the first surface;

a first focus pixel pair and a first adjacent pixel in the substrate, the first focus pixel pair and the first adjacent pixel being separate from each other via a pixel separation pattern, and sequentially arranged in a positive first direction and adjacent to each other, a pixel being absent between the first focus pixel pair and the first adjacent pixel;

a second focus pixel pair and a second adjacent pixel in the substrate, the second focus pixel pair and the second adjacent pixel being separate from each other via the pixel separation pattern, and sequentially arranged in the positive first direction and adjacent to each other, a pixel being absent between the second focus pixel pair and the second adjacent pixel;

a first micro-lens on the first surface of the substrate, and covering the first adjacent pixel;

a second micro-lens on the first surface of the substrate, and covering the second adjacent pixel;

a third micro-lens on the first surface of the substrate, and covering the first focus pixel pair; and a fourth micro-lens on the first surface of the substrate, and covering the second focus pixel pair, a minimum spacing between the first micro-lens and the third micro-lens in the first direction being different from a minimum spacing between the second micro-lens and the fourth micro-lens in the first direction.

13. The image sensor of claim 12, wherein an area of the first micro-lens is different from an area of the second micro-lens.

14. The image sensor of claim 12, wherein the image sensor further comprises:

a color filter layer on the first and second adjacent pixels, and the first and second focus pixel pairs;

a planarization film between the color filter layer and the first to fourth micro-lenses; and a protective layer extending along a surface of each of the first to fourth micro-lenses, a top surface of a portion of the planarization film between the first micro-lens and the third micro-lens, and a top surface of a portion of the planarization film between the second micro-lens and the fourth micro-lens.

15. The image sensor of claim 14, wherein at least a portion of the top surface of the portion of the planarization film between the first micro-lens and the third micro-lens, or at least a portion of the top surface of the portion of the planarization film between the second micro-lens and the fourth micro-lens is recessed into the planarization film.

16. The image sensor of claim 12, wherein the image sensor further comprises:
- a third focus pixel pair and a third adjacent pixel in the substrate, wherein the third focus pixel pair and the third adjacent pixel are separated from each other via the pixel separation pattern, and are sequentially arranged in the positive first direction and are adjacent to each other;
- a fifth micro-lens on the first surface of the substrate, and covering the third adjacent pixel; and
- a sixth micro-lens on the first surface of the substrate, and covering the third focus pixel pair,
- wherein a pixel is absent between the third focus pixel pair and the third adjacent pixel, and
- wherein a minimum spacing between the first micro-lens and the third micro-lens in the first direction is different from a minimum spacing between the third micro-lens and the fifth micro-lens in the first direction.

17. An image sensor comprising:
different first to third focus pixel pairs in a substrate;
- a first adjacent pixel in the substrate and adjacent to the first focus pixel pair in a positive first direction, a pixel being absent between the first focus pixel pair and the first adjacent pixel;
- a second adjacent pixel in the substrate and adjacent to the second focus pixel pair in the positive first direction, a pixel being absent between the second focus pixel pair and the second adjacent pixel;
- a third adjacent pixel in the substrate and adjacent to the third focus pixel pair in the positive first direction, a pixel being absent between the third focus pixel pair and the third adjacent pixel;
- a normal pixel in the substrate and not adjacent to the first focus pixel pair, the second focus pixel pair, and the third focus pixel pair;
- a first micro-lens covering the first adjacent pixel;
- a second micro-lens covering the second adjacent pixel;
- a third micro-lens covering the third adjacent pixel; and
- a fourth micro-lens covering the normal pixel, an area of the first micro-lens being different from each of an area of the second micro-lens, an area of the third micro-lens, and an area of the fourth micro-lens.

18. The image sensor of claim 17, wherein at least one of the area of the first micro-lens, the area of the second micro-lens, and the area of the third micro-lens is larger than the area of the fourth micro-lens.

19. The image sensor of claim 17, wherein at least one of the area of the first micro-lens, the area of the second micro-lens, and the area of the third micro-lens is smaller than the area of the fourth micro-lens.

20. The image sensor of claim 17, wherein the area of the first micro-lens is larger than the area of the second micro-lens and is smaller than the area of the third micro-lens.

* * * * *